(12) United States Patent
Lin et al.

(10) Patent No.: US 12,453,137 B2
(45) Date of Patent: Oct. 21, 2025

(54) FERROELECTRIC MEMORY DEVICES HAVING IMPROVED FERROELECTRIC PROPERTIES AND METHODS OF MAKING THE SAME

(71) Applicant: Taiwan Semiconductor Manufacturing Company Limited, Hsinchu (TW)

(72) Inventors: Po-Ting Lin, Hsinchu (TW); Song-Fu Liao, Hsinchu (TW); Rainer Yen-Chieh Huang, Changhua County (TW); Hai-Ching Chen, Hsinchu (TW); Yu-Ming Lin, Hsinchu (TW); Chung-Te Lin, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 104 days.

(21) Appl. No.: 18/363,189

(22) Filed: Aug. 1, 2023

(65) Prior Publication Data
US 2023/0378354 A1 Nov. 23, 2023

Related U.S. Application Data

(62) Division of application No. 17/481,470, filed on Sep. 22, 2021.
(Continued)

(51) Int. Cl.
*H10D 30/69* (2025.01)
*H10B 51/30* (2023.01)
(Continued)

(52) U.S. Cl.
CPC .......... *H10D 30/701* (2025.01); *H10B 51/30* (2023.02); *H10D 30/6755* (2025.01);
(Continued)

(58) Field of Classification Search
None
See application file for complete search history.

(56) References Cited

U.S. PATENT DOCUMENTS

| | | | | |
|---|---|---|---|---|
| 5,986,301 A | * | 11/1999 | Fukushima | ............ H10B 53/00 257/310 |
| 2002/0054522 A1 | * | 5/2002 | Inoue | ............ H10D 86/00 257/E21.663 |

(Continued)

*Primary Examiner* — Vincent Wall
(74) *Attorney, Agent, or Firm* — The Marbury Law Group, PLLC

(57) ABSTRACT

Ferroelectric devices, including FeFET and/or FeRAM devices, include ferroelectric material layers deposited using atomic layer deposition (ALD). By controlling parameters of the ALD deposition sequence, the crystal structure and ferroelectric properties of the ferroelectric layer may be engineered. An ALD deposition sequence including relatively shorter precursor pulse durations and purge durations between successive precursor pulses may provide a ferroelectric layer having relatively uniform crystal grain sizes and a small mean grain size (e.g., ≤3 nm), which may provide effective ferroelectric performance. An ALD deposition sequence including relatively longer precursor pulse durations and purge durations between successive precursor pulses may provide a ferroelectric layer having less uniform crystal grain sizes and a larger mean grain size (e.g., ≥7 nm). Ferroelectric layers having larger mean grain sizes may exhibit enhanced crystallinity and a stabilized orthorhombic crystal phase, particularly in relatively thin layers (e.g., ≤15 nm in thickness).

20 Claims, 19 Drawing Sheets

Related U.S. Application Data

(60) Provisional application No. 63/181,665, filed on Apr. 29, 2021.

(51) Int. Cl.
  *H10D 30/67* (2025.01)
  *H10D 64/01* (2025.01)
  *H10D 64/68* (2025.01)
  *H10D 99/00* (2025.01)

(52) U.S. Cl.
  CPC ......... *H10D 64/033* (2025.01); *H10D 64/689* (2025.01); *H10D 99/00* (2025.01)

(56) References Cited

U.S. PATENT DOCUMENTS

| | | | | |
|---|---|---|---|---|
| 2004/0023516 A1* | 2/2004 | Londergan | ........ | H01L 21/31645 438/785 |
| 2005/0151210 A1* | 7/2005 | Li | ........ | H10D 30/701 257/E21.208 |
| 2005/0287697 A1* | 12/2005 | Unno | ........ | H01L 21/02118 257/E21.259 |
| 2006/0088660 A1* | 4/2006 | Putkonen | ........ | C23C 16/45531 427/248.1 |
| 2006/0226420 A1* | 10/2006 | Nanai | ........ | H10K 10/466 257/40 |
| 2007/0205976 A1* | 9/2007 | Takatori | ........ | G09G 3/20 345/100 |
| 2009/0163012 A1* | 6/2009 | Clark | ........ | H10D 64/665 257/E21.177 |
| 2009/0184346 A1* | 7/2009 | Jain | ........ | H10D 64/035 257/314 |
| 2010/0140589 A1* | 6/2010 | Ionescu | ........ | H10D 30/0415 257/295 |
| 2010/0270508 A1* | 10/2010 | Xu | ........ | C23C 16/405 427/124 |
| 2011/0256314 A1* | 10/2011 | Ivanov | ........ | C23C 16/405 427/248.1 |
| 2012/0007158 A1* | 1/2012 | Yoon | ........ | H10D 30/701 257/295 |
| 2012/0276694 A1* | 11/2012 | Koezuka | ........ | H10D 99/00 438/151 |
| 2014/0266324 A1* | 9/2014 | Teo | ........ | H10D 62/8503 327/109 |
| 2014/0355328 A1* | 12/2014 | Muller | ........ | G11C 11/2275 257/295 |
| 2015/0041799 A1* | 2/2015 | Morooka | ........ | H10D 86/60 257/43 |
| 2016/0141366 A1* | 5/2016 | Lai | ........ | H10D 30/6757 438/157 |
| 2019/0108998 A1* | 4/2019 | Mueller-Meskamp | ........ | H01L 21/02172 |
| 2019/0164850 A1* | 5/2019 | Lin | ........ | G01R 27/2617 |
| 2019/0165120 A1* | 5/2019 | Sato | ........ | H10D 64/685 |
| 2020/0055134 A1* | 2/2020 | Heo | ........ | H10D 30/701 |
| 2020/0091160 A1* | 3/2020 | Ino | ........ | H10B 63/80 |
| 2020/0105897 A1* | 4/2020 | Hsu | ........ | H01L 21/0228 |
| 2020/0235244 A1* | 7/2020 | Doyle | ........ | H10D 30/6757 |
| 2020/0388685 A1* | 12/2020 | Sharma | ........ | H10D 62/83 |
| 2020/0411695 A1* | 12/2020 | Sung | ........ | H10D 64/689 |
| 2021/0057455 A1* | 2/2021 | Nishida | ........ | H01L 21/02181 |
| 2021/0183993 A1* | 6/2021 | Kim | ........ | H10D 1/692 |
| 2021/0184025 A1* | 6/2021 | Xu | ........ | H10D 62/822 |
| 2021/0249539 A1* | 8/2021 | Zhu | ........ | H10D 64/689 |
| 2021/0328060 A1* | 10/2021 | Zhang | ........ | H01L 21/465 |
| 2022/0173114 A1* | 6/2022 | Schenk | ........ | H01L 21/02337 |
| 2022/0285519 A1* | 9/2022 | Huang | ........ | H10D 30/0415 |
| 2022/0344513 A1* | 10/2022 | Huang | ........ | H10D 30/611 |
| 2022/0352379 A1* | 11/2022 | Lin | ........ | H10D 30/6755 |
| 2023/0089523 A1* | 3/2023 | Narasimhan | ........ | H01L 21/02181 428/336 |

* cited by examiner

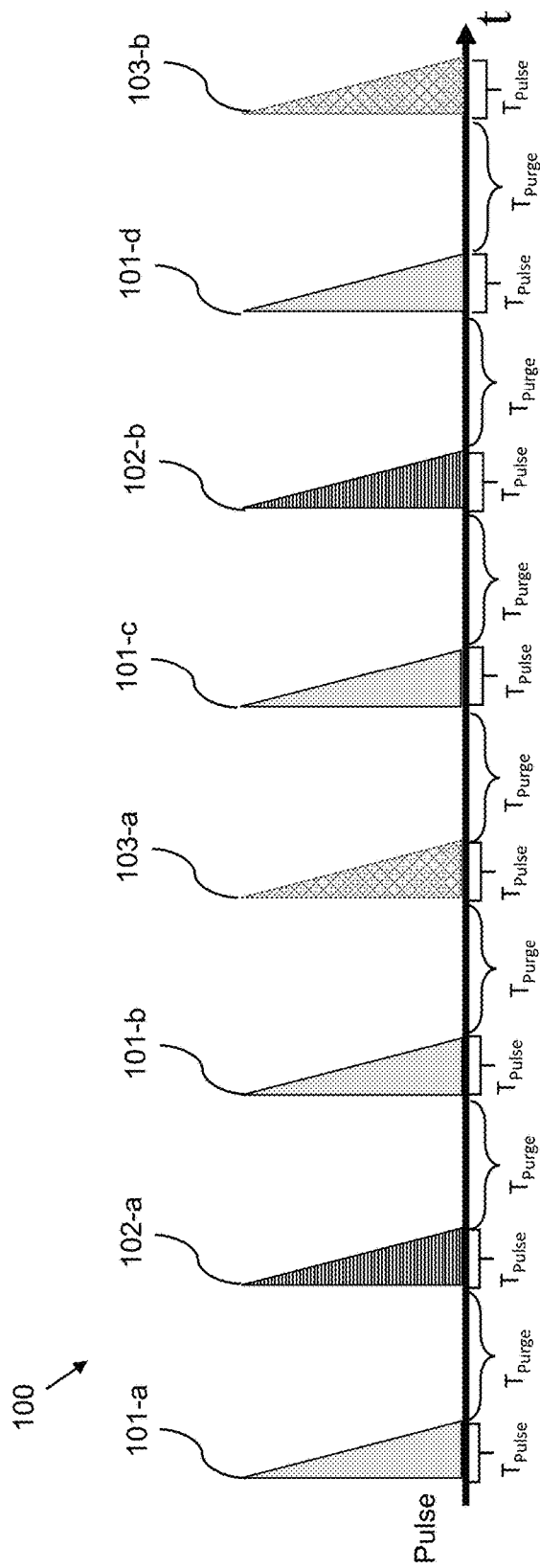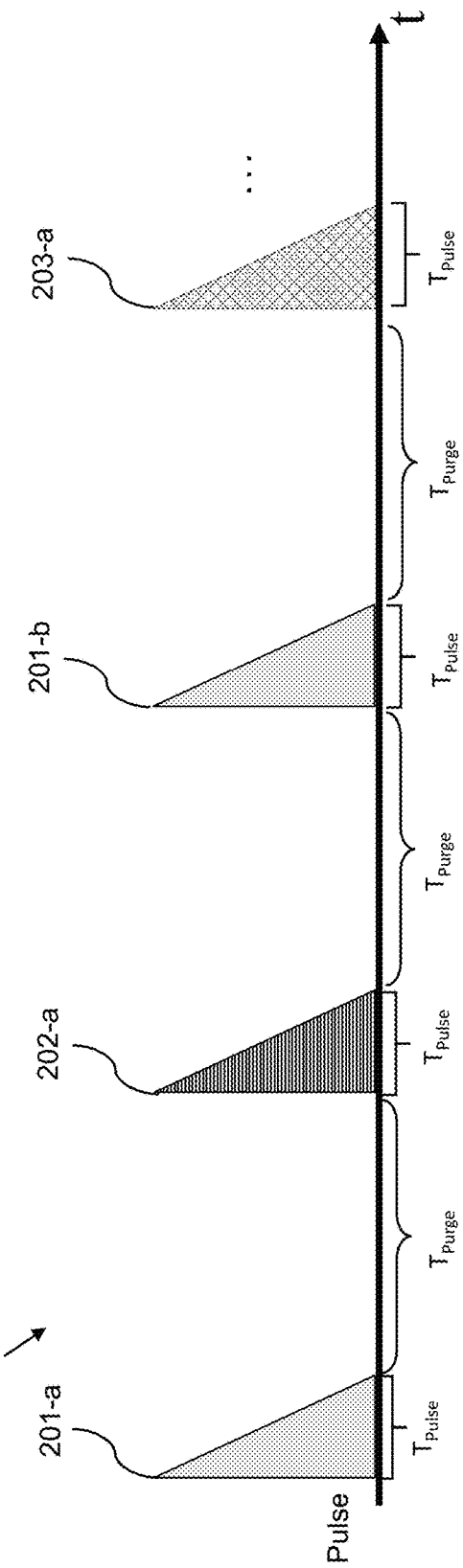
FIG. 1A
FIG. 1B

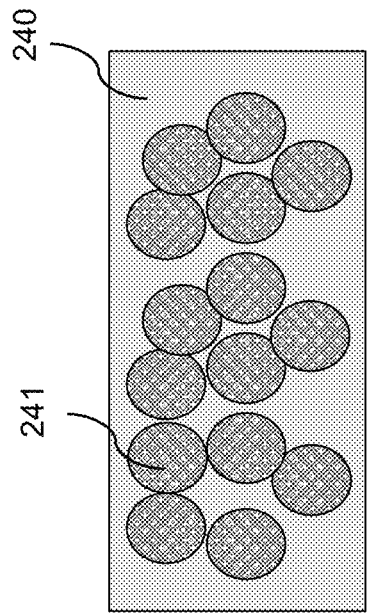
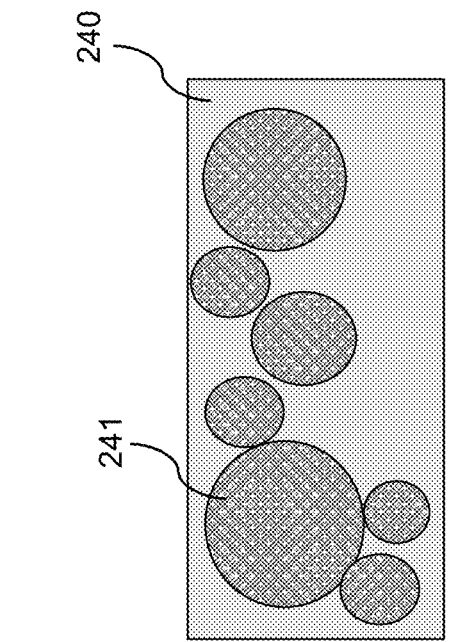
FIG. 2A
FIG. 2B
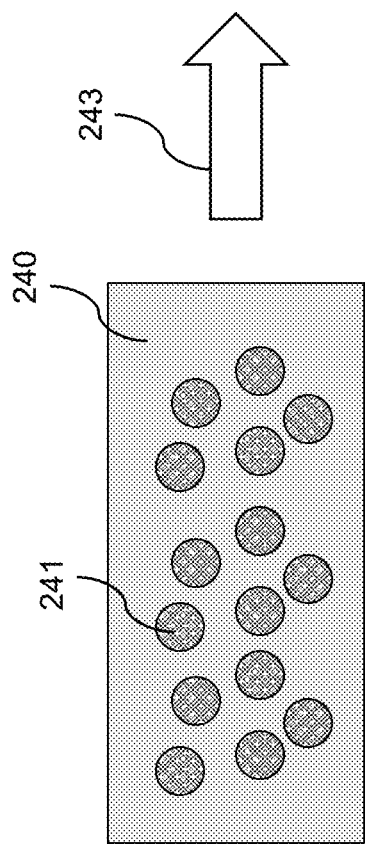
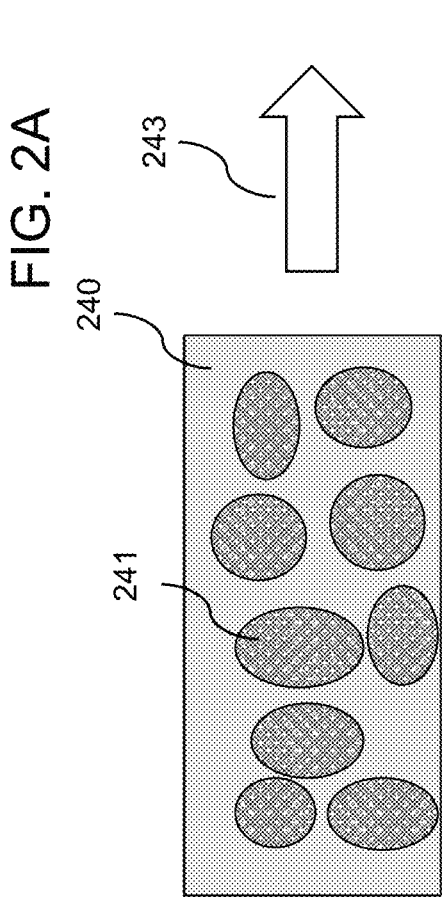

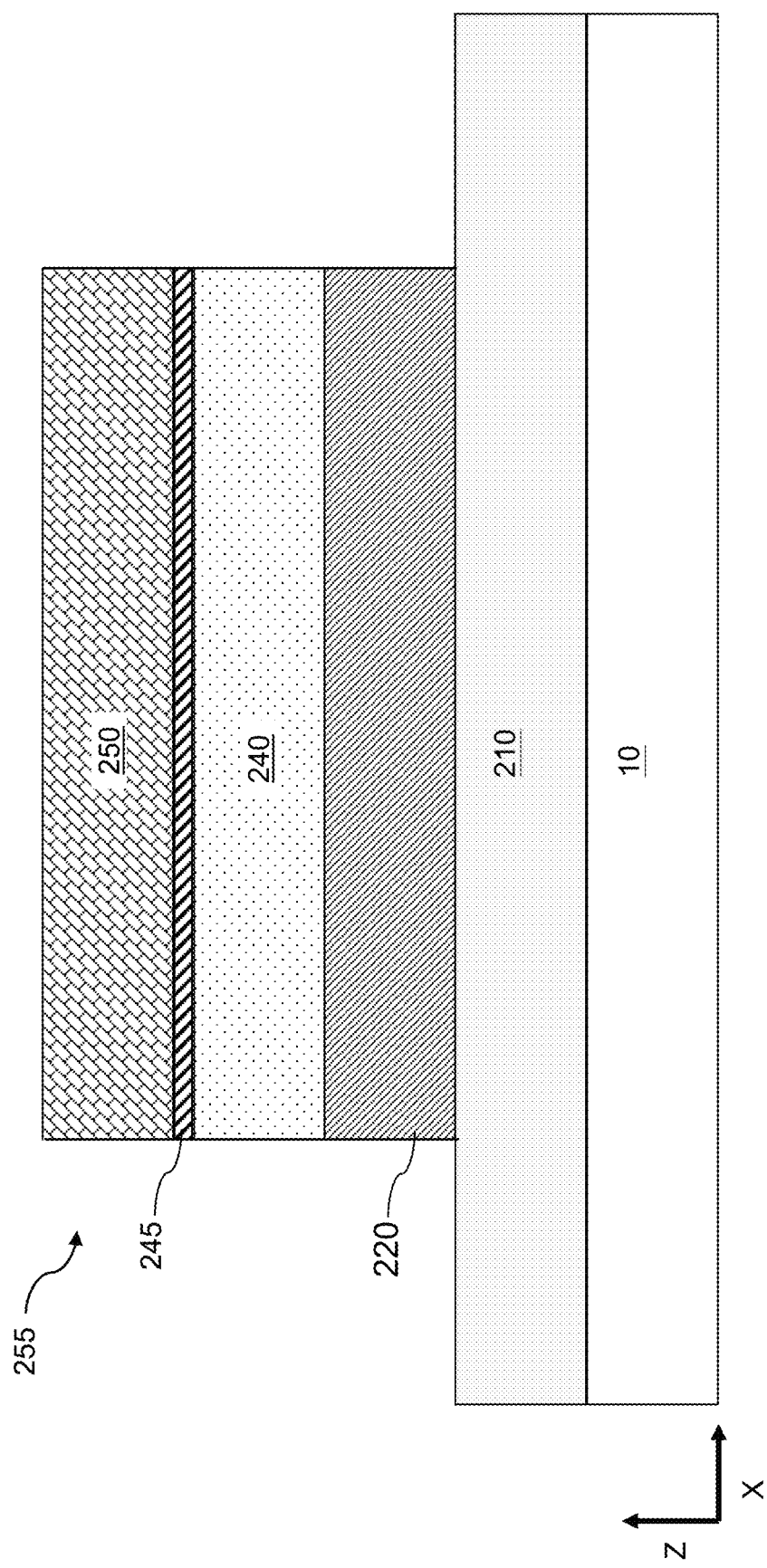

FERROELECTRIC MEMORY DEVICES HAVING IMPROVED FERROELECTRIC PROPERTIES AND METHODS OF MAKING THE SAME

RELATED APPLICATIONS

This application is a divisional application of U.S. patent application Ser. No. 17/481,470 entitled "Ferroelectric Memory Devices Having Improved Ferroelectric Properties and Methods of Making the Same," filed on Sep. 22, 2021, which claims priority from U.S. Provisional Patent Application No. 63/181,665 entitled "Grain Size Engineering by ALD Dose_pulse_duration tuning for Ferroelectric Memory Application" filed on Apr. 29, 2021, the entire contents both of which are hereby incorporated by reference for all purposes.

BACKGROUND

Ferroelectric (FE) memory is a candidate for next generation non-volatile memory benefits due to its fast write/read speed, low power consumption and small size. However, it may be difficult to integrate FE materials with commonly utilized semiconductor device materials and structures while maintaining suitable ferroelectric properties and device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a plot showing a precursor pulse sequence for an atomic layer deposition (ALD) system that may be used to form a ferroelectric (FE) material layer according to various embodiments.

FIG. 1B is a plot showing an alternative precursor pulse sequence for an ALD system that may be used to form an FE material layer according to various embodiments.

FIG. 2A is a schematic illustration of the structure of an FE material layer deposited by an ALD precursor pulse sequence as shown in FIG. 1A prior to and after an anneal process.

FIG. 2B is a schematic illustration of the structure of an FE material layer deposited by an ALD precursor pulse sequence as shown in FIG. 1B prior to and after an anneal process.

FIG. 5F is a vertical cross-section view of an exemplary intermediate structure during a process of forming a FeFET device following an etching process that forms a multilayer structure over the first dielectric material layer according to an embodiment of the present disclosure.

DETAILED DESCRIPTION

Figure 3:
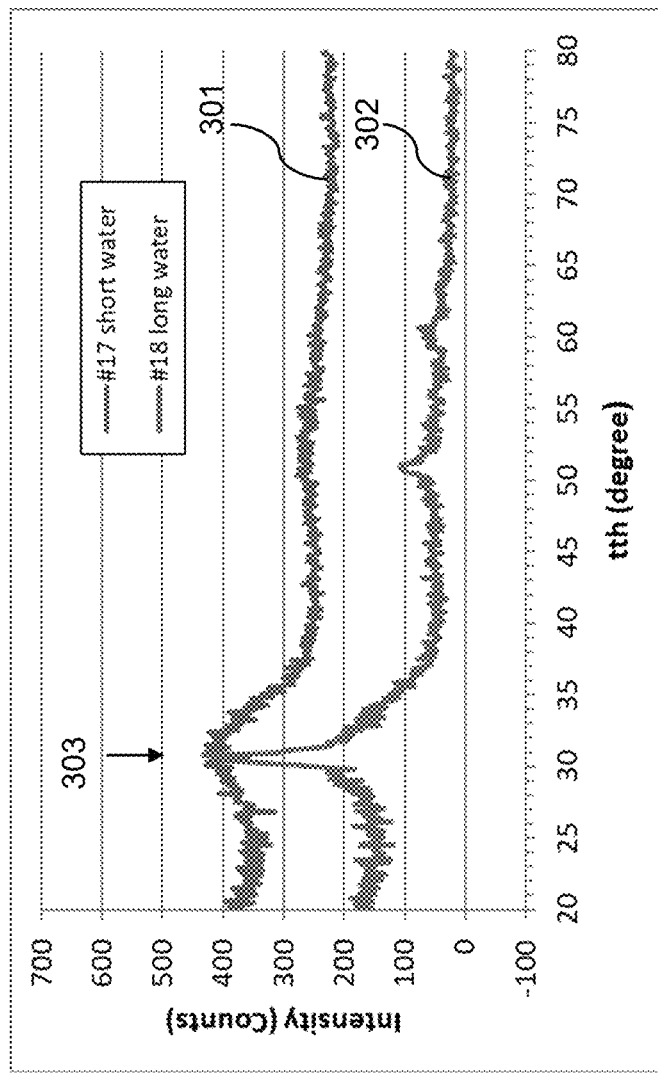
FIG. 3 illustrates X-ray diffraction (XRD) patterns for two sample hafnium zirconium oxide FE material layers deposited by ALD precursor pulse sequences as shown in FIGS. 1A and 1, respectively.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to ferroelectric (FE) structures, including metal-ferroelectric-semiconductor (MFS) structures, such as metal-ferroelectric-semiconductor field effect transistor (MFS-FeFET) structures and ferroelectric random access memory (FeRAM) structures, and specifically, to memory cells, transistors, and memory structures that include FE materials.

A ferroelectric material is a material that may have spontaneous nonzero electrical polarization (i.e., non-zero total electrical dipole moment) when the external electrical field is zero. The spontaneous electrical polarization may be reversed by a strong external electric field applied in the opposite direction. The electrical polarization is dependent not only on the external electrical field at the time of measurement, but also on the history of the external electrical field, and thus, has a hysteresis loop. The maximum of the electrical polarization is referred to as saturation polarization. The electrical polarization that remains after an external electrical field that induces saturation polarization is no longer applied (i.e., turned off) is referred to as remnant polarization. The magnitude of the electrical field that needs to be applied in the opposite direction of the remnant polarization in order to achieve zero polarization is referred to as coercive electrical field.

Various embodiments are directed to ferroelectric field effect transistor (FeFET) structures and methods for making the same. FeFETs are emerging devices, in which a FE layer is utilized as a gate insulating layer between a gate electrode and a channel region of a semiconductor material layer. Permanent electrical field polarization in the FE layer causes this type of device to retain the transistor's state (on or off) in the absence of any electrical bias.

In some embodiments, a ferroelectric (FE) structure, such as a FeFET structure, may form a memory cell of a memory array. In a FeFET-based memory cell, the FE material located between the gate electrode and the channel region of the semiconductor material layer may have two stable remnant polarization states. In one remnant polarization state, the FeFET may be permanently in an "on" state, and in the other remnant polarization state, the FeFET may be permanently in an "off" state. Thus, the polarization state of the FE layer may be used to encode information (i.e., bits) in a non-volatile manner. The logic state of the FeFET-based memory cell may be read non-destructively by sensing the resistance across the terminals (e.g., source and drain terminals) of the FeFET. To re-program the FeFET-based memory cell, a sufficiently high voltage may be applied to the FeFET to induce the polarization state of the FE material to reverse and thereby change the logic state of the FeFET memory cell.

Additional embodiments are directed to ferroelectric random access memory (FeRAM) structures and methods of making the same. FeRAMs are another type of memory device in which each storage element (i.e., "memory cell") includes a capacitor electrically coupled to an access transistor in a one-transistor, one-capacitor (i.e., "1T-1C") configuration. The access transistor of a FeRAM memory cell may be a metal oxide semiconductor field effect transistor (MOSFET), and may be a thin-film transistor (TFT). The capacitor of a FeRAM memory cell may include a ferroelectric (FE) dielectric layer located between a pair of metal electrode plates. One of the electrode plates of the capacitor may be coupled to a terminal of the access transistor, such that the access transistor may be used to control the charge on the capacitor that includes the FE material layer.

In a FeRAM memory cell, the polarization state of the FE layer in the capacitor may be used to encode the logic state of the memory cell. The FeRAM memory cell may be programmed by applying an electric charge to the electrode plates of the capacitor that causes the FE material layer between the electrode plates to become polarized in one of two stable remnant polarization states. The direction of the remnant polarization of the FE material layer may encode the logic state (i.e., "0" or "1") of the memory cell in a non-volatile manner. To read the logic state of a FeRAM memory cell, the access transistor may force the FE material layer of the capacitor into a predetermined logic state (e.g., a "0" logic state) and the current on an output line of the capacitor may be sensed. In the case where the capacitor was already programmed to have the predetermined logic state (e.g., a "0" logic state), no current is sensed on the output line of the capacitor, thereby indicating that the memory cell was programmed to have the predetermined logic state. However, in the case where the capacitor was programmed to have the opposite logic state (e.g., a "1" logic state), the reversal of the polarization state of the FE material layer causes a short current pulse to flow on the output line of the capacitor. The sensing of this current pulse indicates that the cell was programmed to have the opposite logic state from the predetermined logic state (e.g., a "1" logic state). Since this process may overwrite the logic state of the memory cells, the read process in a FeRAM memory device is considered a destructive process, and the logic states of the memory cells may require re-programming following a read operation.

For the purposes of forming ferroelectric-based memory devices, it is generally desirable to have high remnant polarization and high coercive electrical field. High remnant polarization may increase the magnitude of an electrical signal. A high coercive electrical field makes the memory devices more stable against perturbations caused by noise-level electrical field and interferences.

The ferroelectric properties of a FE material layer, such as remnant polarization, coercive field (Ec), polarization-electric field (P-E) loop squareness, etc., may depend upon the crystal structure of the FE material layer. In particular, for hafnium oxide (HfO)-based ferroelectric materials, such as hafnium zirconium oxide (HZO), good FE properties may be dependent upon having a well-formed and stable orthorhombic crystalline phase. For example, FE materials, such as HZO, require a strong orthorhombic phase to exhibit high polarization and coercive field. Both of these properties impact the FE device's ability to maintain data in memory.

The fabrication of FE device structures, such as FeFET and FeRAM structures, using thin film transistor (TFT) technologies and structures, including the use of oxide semiconductors, is an attractive option for back-end-of-line (BEOL) integration since TFTs may be processed at low temperatures and thus, will not damage previously fabricated devices. However, to date it has proven difficult to fabricate ferroelectric material layers having crystal structures that provide adequate ferroelectric properties and device performance.

In various embodiments, a ferroelectric (FE) material layer, such as a hafnium oxide-based FE material layer, for a FE device structure, may be deposited using atomic layer deposition (ALD). The ALD deposition process is a thin-film deposition process in which a film is grown on a surface by exposing the surface to an alternating sequence of gaseous species, which may be referred to as precursor pulses. Various embodiments include controlling parameters of the ALD deposition sequence to engineer the crystal structure and ferroelectric properties of a FE material layer in a FE device structure. In some embodiments, a FE material layer may be formed using an ALD deposition sequence including relatively shorter precursor pulse durations, $T_{pulse}$, and relatively shorter purge durations, $T_{purge}$, between successive precursor pulses. This may provide a FE material layer having relatively uniform crystal grain sizes and a small mean grain size (e.g., ≤3 nm), which may provide effective ferroelectric performance. In other embodiments, a FE material layer may be formed using an ALD deposition sequence including relatively longer precursor pulse durations, $T_{pulse}$, and relatively longer purge durations, $T_{purge}$, between successive precursor pulses. This may provide a FE material layer having less uniform crystal grain sizes and a larger mean grain size (e.g., ≥7 nm). It has been discovered that FE material layers having larger mean grain sizes may exhibit enhanced crystallinity along a direction normal to the surface on which the layer is deposited and include a stabilized orthorhombic crystal phase, particularly in relatively thin FE material layers (e.g., ≤15 nm in thickness), and may thereby provide improved ferroelectric properties.

FIGS. 1A and 1B are plots showing precursor pulse sequences 100, 200 for an atomic layer deposition (ALD) system that may be used to form a ferroelectric (FE) material layer according to various embodiments. In the exemplary embodiments shown in FIGS. 1A and 1B, the FE material layer that is deposited by ALD may include hafnium zirconium oxide, $Hf_xZr_{1-x}O_2$, 0≤x≤1, (i.e., "HZO"), such as $Hf_{0.5}Zr_{0.5}O_2$, although it will be understood that other suitable ferroelectric material layers may be deposited using an ALD pulse sequence as shown in FIGS. 1A and 1B using appropriate precursor species.

Referring to FIGS. 1A and 1B, the sequences 100, 200 of ALD precursor pulses introduced into an ALD reaction chamber are schematically illustrated over time, t. Prior to the start of the ALD deposition process, an in-progress device structure, such as an in-progress FeFET and/or FeRAM structure, may be placed in the ALD reaction chamber. In the pulse sequence 100 shown in FIG. 1A, a first precursor pulse 101-a including a first precursor material may be introduced into the ALD reaction chamber. In embodiments, the first precursor pulse 101-a may include an oxygen precursor material, such as water vapor ($H_2O$), oxygen gas ($O_2$), and/or ozone ($O_3$). Other suitable oxygen precursors are within the contemplated scope of disclosure. The first precursor may react with the material(s) of an exposed surface of the in-progress device structure, which may be, for example, a dielectric material, a conductive material (e.g., a metal), and/or a semiconductor material, to deposit a layer of oxygen on the surface of the in-progress device structure. In the pulse sequence 100 shown in FIG. 1A, the first precursor pulse 101-a may be introduced into the ALD reaction chamber during a pulse duration, $T_{pulse}$, that is 1 second or less, such as 0.1-1 second.

Referring again to FIG. 1A, following the introduction of the first precursor pulse 101-a, the ALD reaction chamber may be purged using an inert gas (e.g., $N_2$, Ar, etc.). The ALD reaction chamber may be purged over a purge duration, $T_{purge}$, that may be 3 seconds or less, such as between about 2 seconds and 3 seconds. Following the purging of the ALD reaction chamber, a second precursor pulse 102-a may be introduced into the ALD reaction chamber. In various embodiments, the second precursor pulse 102-a may include a hafnium precursor. Suitable hafnium precursors may include, for example, hafnium tetrachloride ($HfCl_4$), bis (methyl-$\eta^5$-cylopentadienyl)dimethylhafnium ($Hf[C_5H_4(CH_3)]_2(CH_3)_2$), bis(methyl-$\eta^5$-cylopentadienyl) methoxymethylhafnium ($HfCH_3(OCH_3)[(C_2H_5(CH_3)]_2$, tetrakis(dimethylamido) hafnium(IV) ($Hf(N(CH_3)_2)_4$), and tetrakis(ethylmethylamido) hafnium (IV) ($HF(N(CH_3(C_2H_5)))_4$). Other suitable hafnium precursors are within the contemplated scope of disclosure. The hafnium precursor may react with oxygen to deposit a layer of hafnium on the previously-deposited oxygen layer. In the pulse sequence 100 shown in FIG. 1A, the second precursor pulse 102-a may be introduced into the ALD reaction chamber over a pulse duration, $T_{pulse}$, that is 1 second or less, such as 0.1-1 second.

Referring again to FIG. 1A, following the introduction of the second precursor pulse 102-a, the ALD reaction chamber may again be purged using an inert gas over a purge duration, $T_{purge}$, that may be 3 seconds or less, such as between about 2 seconds and 3 seconds. Following the purging of the ALD reaction chamber, a first precursor pulse 101-b including a first precursor material may be introduced into the ALD reaction chamber. The first precursor material may be an oxygen precursor as described above. The first precursor may react with hafnium to deposit a layer of oxygen on the previously-deposited hafnium layer. The first precursor pulse 101-b may be introduced into the ALD reaction chamber over a pulse duration, $T_{pulse}$, that is 1 second or less, such as 0.1-1 second.

Referring again to FIG. 1A, following the introduction of the first precursor pulse 101-b, the ALD reaction chamber may be purged using an inert gas over a purge duration, $T_{purge}$, that may be 3 seconds or less, such as between about 2 seconds and about 3 seconds. Following the purging of the ALD reaction chamber, a third precursor pulse 103-a may be introduced into the ALD reaction chamber. In various embodiments, the third precursor pulse 103-a may include a zirconium precursor. Suitable zirconium precursors may include, for example, zirconium tetrachloride ($ZrCl_4$), zirconium(IV) tert-butoxide ($Zr[OC(CH_3)_3]_4$), bis(methyl-$\eta^5$-cyclo-pentadienyl) methoxymethylzirconium ($Zr(CH_3C_5H_4)_2CH_3OCH_3$), tetrakis(dimethylamido) zirconium (IV) ($Zr(N(CH_3)_2)_4$), and tetrakis(ethylmethylamido) zirconium (IV) ($Zr(N(CH_3(C_2H_5)))_4$). Other suitable zirconium precursors are within the contemplated scope of disclosure. The third precursor may react with oxygen to deposit a layer of zirconium on the previously-deposited oxygen layer. In the pulse sequence 100 shown in FIG. 1A, the third precursor pulse 103-a may be introduced into the ALD reaction chamber over a pulse duration, $T_{pulse}$, that is 1 second or less, such as 0.1-1 second.

This sequence may then be repeated by introducing a first precursor pulse 101-c of the oxygen precursor, followed by a second precursor pulse 102-b of the hafnium precursor, a first precursor pulse 101-d of the oxygen precursor, and a third precursor pulse 103-b of the zirconium precursor, and so forth, to deposit a layer of ferroelectric material (i.e., hafnium zirconium oxide) having a desired thickness over a surface of the in-progress device structure. In embodiments, the total thickness of the layer of ferroelectric material may be in a range from 0.1 nm to 100 nm, although lesser and greater thicknesses may also be used.

It will be understood that the order of the precursor pulses in the pulse sequence 100 shown in FIG. 1A may be modified in various embodiments. For example, the order of the second precursor pulse(s) 102 containing a hafnium precursor and the third precursor pulse(s) 103 containing a zirconium precursor may be reversed such that the initial zirconium layer may be deposited before the initial hafnium layer is deposited. In other embodiments, the initial precursor pulse may be a second precursor pulse 102 containing a hafnium precursor, followed by a first precursor pulse 101 containing an oxygen precursor, a third precursor pulse 103 containing a zirconium precursor, and another first precursor pulse 101 containing an oxygen precursor, and this pulse sequence may be repeated a desired number of times to deposit the ferroelectric material layer. Alternatively, the initial precursor pulse of the pulse sequence may be a third precursor pulse 103 containing a zirconium precursor, followed by a first precursor pulse 101 containing an oxygen precursor, a second precursor pulse 102 containing a hafnium precursor, and another first precursor pulse 101 containing an oxygen precursor, and this sequence may be repeated a desired number of times to deposit the ferroelectric material layer.

FIG. 1B illustrates an alternative pulse sequence 200 of ALD precursor pulses for forming a ferroelectric material layer. The pulse sequence 200 shown in FIG. 1B may be similar to the pulse sequence 100 of FIG. 1A, except that the alternative pulse sequence 200 may utilize longer pulse durations, $T_{pulse}$, for each precursor pulse, and may include longer purge durations, $T_{purge}$, between each successive precursor pulse. For ease of description, the pulse sequence 100 as shown and described with reference FIG. 1A may also be referred to as a "short pulse/purge" sequence, and a pulse sequence 200 as shown in FIG. 1B and described in further detail below may also be referred to as a "long pulse/purge" sequence.

Referring to FIG. 1B, a first precursor pulse 201-a may include a first precursor material. In embodiments, the first precursor pulse 201-a may include an oxygen precursor material as described above. In the pulse sequence 200 shown in FIG. 1B, the first precursor pulse 201-a may be introduced into the ALD reaction chamber during a pulse duration, $T_{pulse}$, that is greater than 1 second. In various embodiments, $T_{pulse}$ may be in a range that is greater than 1 second and up to about 5 seconds.

Following the introduction of the first precursor pulse 201-a, the ALD reaction chamber may be purged using an inert gas (e.g., $N_2$, Ar, etc.). The ALD reaction chamber may be purged over a purge duration, $T_{purge}$, that may be greater than 3 seconds. In various embodiments, $T_{purge}$ may be in a range that is greater than 3 seconds and up to about 10 seconds. Following the purging of the ALD reaction chamber, a second precursor pulse 202-a may be introduced into the ALD reaction chamber. In various embodiments, the second precursor pulse 202-a may include a hafnium precursor, as described above. The second precursor pulse 202-a may be introduced into the ALD reaction chamber over a pulse duration, $T_{pulse}$, that is greater than 1 second (e.g., 1 sec.$<T_{pulse}\leq\sim5$ sec.).

Following the introduction of the second precursor pulse 202-a, the ALD reaction chamber may again be purged using an inert gas over a purge duration, $T_{purge}$ that is greater than 3 seconds (e.g., 3 sec.$<T_{purge}\leq\sim10$ sec.). Then, a first precursor pulse 201-b containing an oxygen precursor may be introduced into the ALD reaction chamber over a pulse duration, $T_{pulse}$, that is greater than 1 second (e.g., 1 sec.$<T_{pulse}\leq\sim5$ sec.). The reaction chamber may again be purged using an inert gas over a purge duration, $T_{purge}$ that is greater than 3 seconds (e.g., 3 sec.$<T_{purge}\leq\sim10$ sec.). A third precursor pulse 203-a containing a zirconium precursor as described above may then be introduced into the ALD reaction chamber over a pulse duration, $T_{pulse}$, that is greater than 1 second (e.g., 1 sec.$<T_{pulse}\leq\sim5$ sec.).

This sequence may then be repeated by introducing a first precursor pulse 201 of the oxygen precursor, followed by a second precursor pulse 202 of the hafnium precursor, a first precursor pulse 201 of the oxygen precursor, and a third precursor pulse 203 of the zirconium precursor, and so forth, to deposit a layer of ferroelectric material (i.e., hafnium zirconium oxide) having a desired thickness over a surface of the in-progress device structure. In embodiments, the total thickness of the layer of ferroelectric material may be in a range from 0.1 nm to 100 nm, although lesser and greater thicknesses may also be used.

The order of the precursor pulses in the pulse sequence 200 shown in FIG. 1B may be modified in various embodiments. For example, the order of the second precursor pulse(s) 202 containing a hafnium precursor and the third precursor pulse(s) 203 containing a zirconium precursor may be reversed such that the initial zirconium layer may be deposited before the initial hafnium layer is deposited. In other embodiments, the initial precursor pulse may be a second precursor pulse 202 containing a hafnium precursor, followed by a first precursor pulse 201 containing an oxygen precursor, a third precursor pulse 203 containing a zirconium precursor, and another first precursor pulse 201 containing an oxygen precursor, and this pulse sequence may be repeated a desired number of times to deposit the ferroelectric material layer. Alternatively, the initial precursor pulse of the pulse sequence may be a third precursor pulse 203 containing a zirconium precursor, followed by a first precursor pulse 201 containing an oxygen precursor, a second precursor pulse 202 containing a hafnium precursor, and another first precursor pulse 201 containing an oxygen precursor, and this sequence may be repeated a desired number of times to deposit the ferroelectric material layer.

The ferroelectric material layer deposited using an ALD pulse sequence 100 having relatively shorter pulse durations, $T_{pulse}$, and purge durations, $T_{purge}$ as shown in FIG. 1A (i.e., a "short pulse/purge" sequence) may have a different structure and ferroelectric properties as compared to a ferroelectric material layer deposited using an ALD pulse sequence 200 having relatively longer pulse durations, $T_{pulse}$, and purge durations, $T_{purge}$ as shown in FIG. 1B (i.e., a "long pulse/purge" sequence). This is illustrated in FIGS. 2A and 2B which schematically illustrate the structures of FE material layers 240 deposited by a short pulse/purge ALD sequence 100 (FIG. 2A) and by a long pulse/purge sequence 200 (FIG. 2B). The left-hand sides of FIGS. 2A and 2B illustrate as-deposited FE material layers 240 following the ALD deposition process, and the right-hand sides of FIGS. 2A and 2B illustrate the FE material layers 240 following an annealing process, such as an anneal at a temperature between 300° C. and 900° C. for between 1 second and 1 hour.

As shown on the left-hand side of FIG. 2A, the as-deposited FE material layer 240 using the short pulse/purge sequence 100 is near amorphous in structure, including grains 241 having a relatively small mean grain size and an overall low level of crystallinity. In contrast, the as-deposited FE material layer 240 using the long pulse/purge sequence 200 shown on the left-hand side of FIG. 2B includes grains 241 having a significantly larger mean grain size and exhibits a much higher level of crystallinity.

The right-hand sides of FIGS. 2A and 2B illustrate the FE material layers 240 deposited using the short pulse/purge sequence 100 and the long pulse/purge sequence 200, respectively, following an anneal process (indicated by arrow 243) at a temperature between 300° C. and 900° C. for between 1 second and 1 hour. As shown in FIG. 2A, following the anneal process 243, the FE material layer 240 deposited using the short pulse/purge sequence 100 has a significantly increased crystallinity, and includes substantially uniform-sized crystal grains 241. In various embodiments, the mean grain size of the annealed FE material layer formed via the short pulse/purge sequence 100 may be less than about 3 nm as determined using the Scherrer equation.

As shown in FIG. 2B, following the anneal process 243, the FE material layer 240 deposited using the long pulse/purge sequence 200 includes a crystal structure having significantly less uniformity in grain size as compared to the FE material layer deposited using the short pulse/purge sequence 100. In addition, the mean size of the crystal grains 241 in FIG. 2B is significantly larger than in the FE material layer of FIG. 2A. In various embodiments, the mean grain size of the annealed FE material layer formed via the long pulse/purge sequence 200 may be greater than 7 nm (e.g., between 8 nm and 12 nm), and may be about 10 nm or greater as determined using the Scherrer equation.

FIG. 3 show X-ray diffraction (XRD) patterns for two sample hafnium zirconium oxide FE material layers. Line 301 is the XRD pattern for a FE material layer formed using a short pulse/purge ALD deposition sequence 100 such as shown in FIG. 1A. Line 302 is the XRD pattern for a FE material layer formed using a long pulse/purge ALD deposition sequence 200 such as shown in FIG. 1B. Both samples were formed by ALD using the same ratios of pulse duration to purge duration ($T_{pulse}$:$T_{purge}$) during the deposition process and both samples included substantially identical thicknesses and Hf:Zr:O ratios. The arrow 303 illustrates the XRD peak for the (111) crystal plane at approximately 31 degrees, and is indicative of the presence of crystal phases, including orthorhombic (o-phase), tetragonal (t-phase) and cubic (c-phase) crystal phases, that promote ferroelectric properties of the material. The narrow, well-defined peak of line 302 indicates the presence of larger crystal grain sizes in the FE material layer formed using the long pulse/purge deposition sequence 200.

For FE device structures, such as FeFET and FeRAM structures, a FE material layer having smaller and uniform grain sizes is typically utilized in order to provide smaller grain boundaries and minimize leakage current. A smaller and more uniform grain size may also help stabilize crystal structures, such as orthorhombic crystal phases, that promote ferroelectric properties of the FE material layer.

However, it has been discovered that an FE material layer having a relatively larger mean grain size, such as a mean grain size of 7 nm or more, including up to 10 nm or more, may exhibit excellent ferroelectric properties, including high remnant polarization (2Pr). In particular, FE material layers formed using a long pulse/purge ALD deposition sequence 200 and having a relatively larger mean grain size may have enhanced crystallinity along a direction normal to the surface on which the layer is deposited (i.e., the "z-axis direction") and have been shown to have a stabilized orthorhombic crystal phase. The ferroelectric characteristics of FE material layers formed using a long pulse/purge sequence are especially strong in relatively thin FE material layers. In thicker FE material layers, the grain sizes may become excessively large, and the preferred crystal phases for ferroelectric properties, such as the orthorhombic crystal phases, may become unstable.

Thus, in various embodiments, a method of fabricating ferroelectric (FE) device structures, such as a FeFET structure and/or a FeRAM structure, may include depositing the FE material layer using a short pulse/purge ALD deposition sequence in embodiments in which the thickness of the FE material layer is greater than a threshold thickness, and depositing the FE material layer using a long pulse/purge ALD deposition sequence when the thickness of the FE material layer is less than or equal to the threshold thickness. In various embodiments, the threshold thickness may be in a range between 5 nm and 15 nm, such as between 8 nm and 12 nm, including about 10 nm.

Figure 4A:
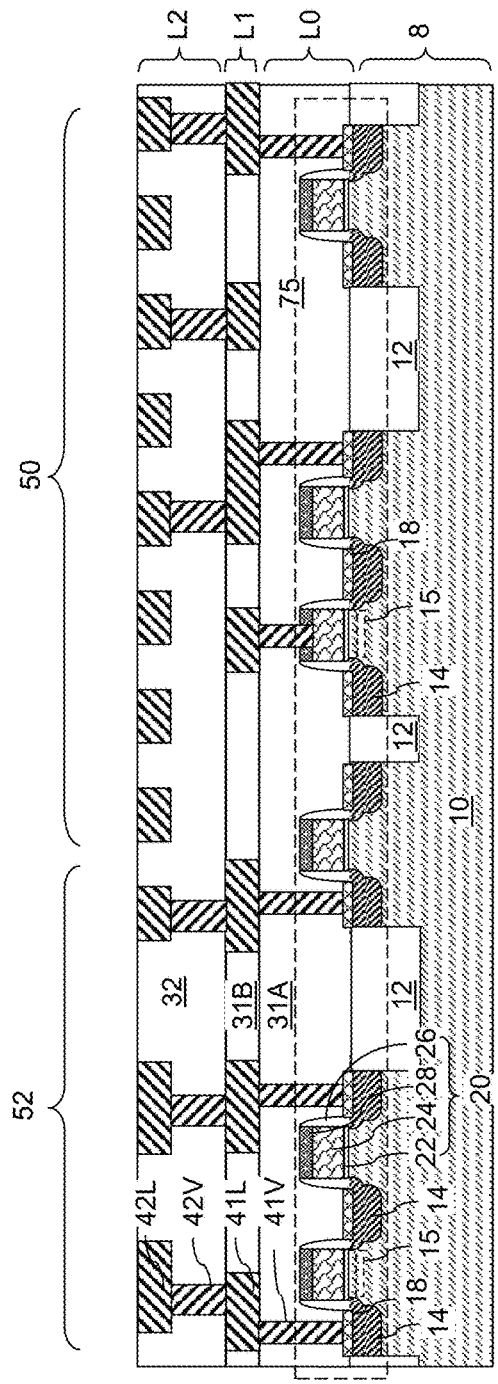
FIG. 4A is a vertical cross-sectional view of a first exemplary structure prior to formation of an array of ferroelectric (FE) device structures according to an embodiment of the present disclosure.

FIG. 4A is a vertical cross-sectional view of a first exemplary structure prior to formation of an array of FE device structures, such as FeFET and/or FeRAM memory devices according to an embodiment of the present disclosure. Referring to FIG. 4A, a first exemplary structure according to an embodiment of the present disclosure is illustrated prior to formation of an array of FE device structures, according to various embodiments of the present disclosure. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which may include a memory array region 50 in which at least one array of non-volatile memory cells may be subsequently formed.

The exemplary structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Semiconductor devices such as field effect transistors (FETs) may be formed on, and/or in, the semiconductor material layer 10 during a front-end-of-line (FEOL) operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. Complementary metal-oxide-semiconductor (CMOS) circuits 75 may be provided on the semiconductor material layer 10, which may include a periphery circuit for the array(s) of transistors, such as thin film transistors (TFTs), and memory devices to be subsequently formed.

Various interconnect-level structures may be subsequently formed, which are formed prior to formation of an array of fin back gate field effect transistors and are herein referred to as lower interconnect-level structures (L0, L1, L2). In case a two-dimensional array of TFTs and memory devices are to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric (ILD) layer 31B and first metal lines 41L formed within the first ILD layer 31B. The first ILD layer 31B is also referred to as a first line-level dielectric layer. The first metal lines 41L may contact a respective one of the contact via structures 41V. The second interconnect-level structure L2 includes a second ILD layer 32, which may include a stack of a first via-level dielectric material layer and a second line-level dielectric material layer or a line-and-via-level dielectric material layer. The second ILD layer 32 may have formed there within second interconnect-level metal interconnect structures (42V, 42L), which includes first metal via structures 42V and second metal lines 42L. Top surfaces of the second metal lines 42L may be coplanar with the top surface of the second ILD layer 32.

Figure 4B:
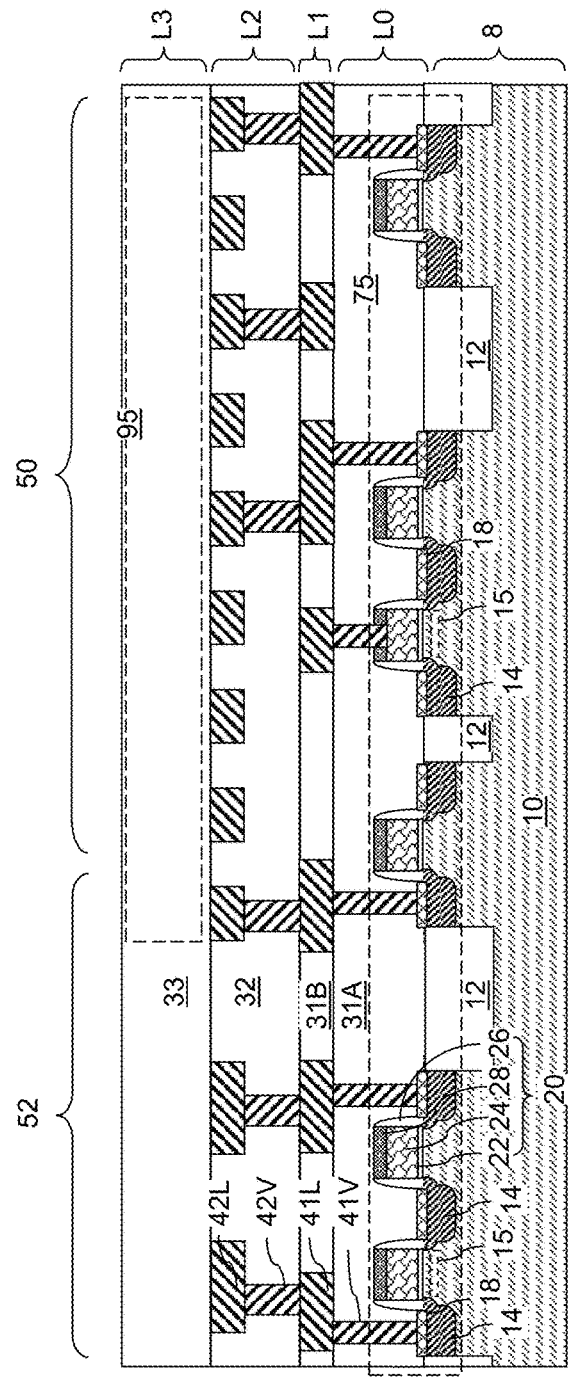
FIG. 4B is a vertical cross-sectional view of the first exemplary structure during formation of the array of FE device structures according to an embodiment of the present disclosure.

FIG. 4B is a vertical cross-sectional view of the first exemplary structure during formation of an array of ferroelectric-based devices, such as TFT FeFET memory cells and/or FeRAM memory cells, according to an embodiment of the present disclosure. Referring to FIG. 4B, an array 95 of non-volatile memory cells, such as TFT FeFET devices and/or FeRAM devices, may be formed in the memory array region 50 over the second interconnect-level structure L2. The details for the structure and the processing steps for the array 95 of non-volatile memory cells are subsequently described in detail below. A third ILD layer 33 may be formed during formation of the array 95 of non-volatile memory cells. The set of all structures formed at the level of the array 95 of non-volatile memory cells is herein referred to as a third interconnect-level structure L3.

Figure 4C:
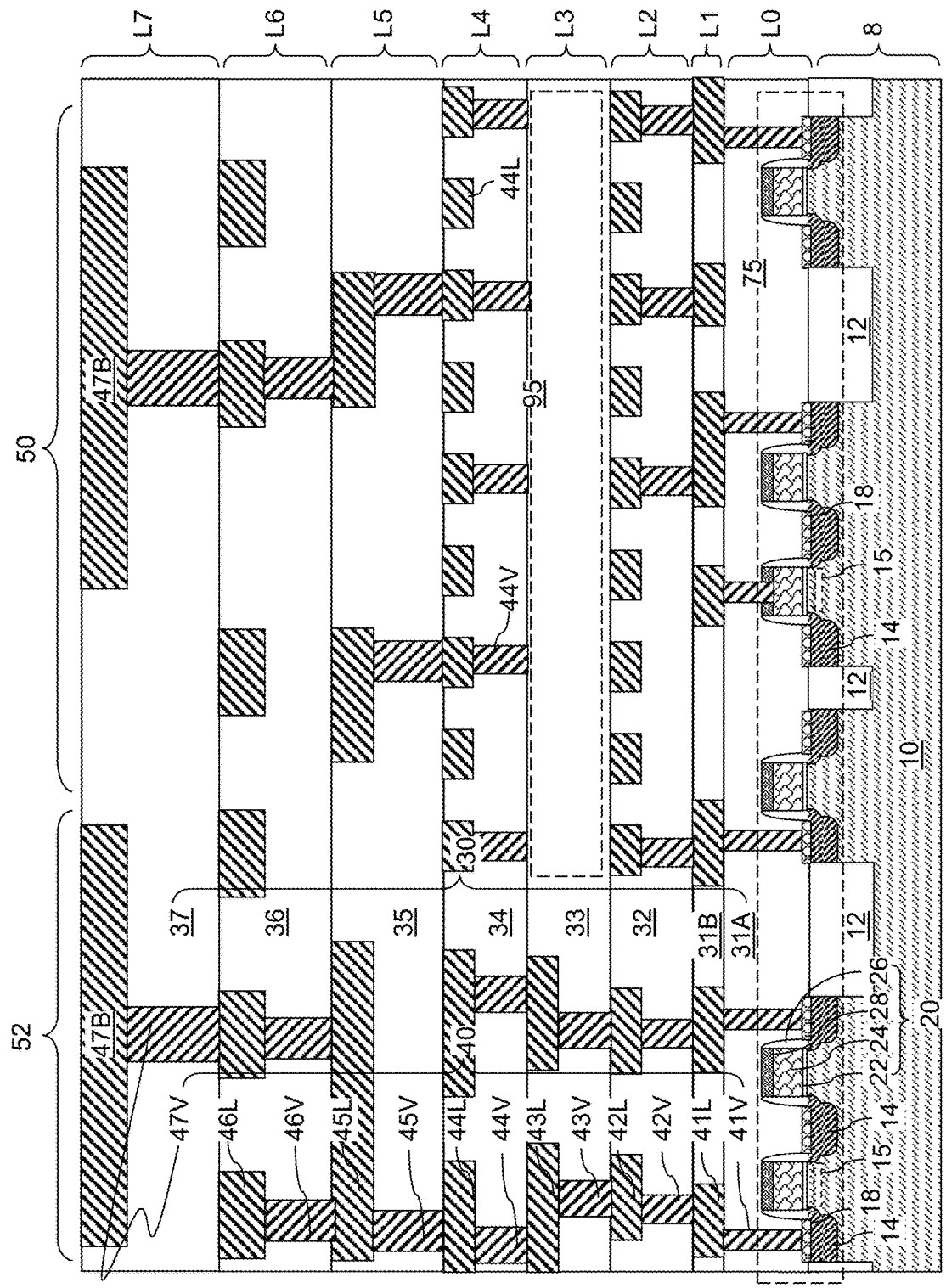
FIG. 4C is a vertical cross-sectional view of the first exemplary structure after formation of upper-level metal interconnect structures according to an embodiment of the present disclosure.

FIG. 4C is a vertical cross-sectional view of the first exemplary structure after formation of upper-level metal interconnect structures according to an embodiment of the present disclosure. Referring to FIG. 4C, third interconnect-level metal interconnect structures (43V, 43L) may be formed in the third ILD layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth ILD layer 34 having formed therein fourth interconnect-level metal interconnect structures (44V, 44L), which may include third metal via structures 44V and fourth metal lines 44L. The fifth interconnect-level structure L5 may include a fifth ILD layer 35 having formed therein fifth interconnect-level metal interconnect structures (45V, 45L), which may include fourth metal via structures 45V and fifth metal lines 45L. The sixth interconnect-level structure L6 may include a sixth ILD layer 36 having formed therein sixth interconnect-level metal interconnect structures (46V, 46L), which may include fifth metal via structures 46V and sixth metal lines 46L. The seventh interconnect-level structure L7 may include a seventh ILD layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each ILD layer may be referred to as an ILD layer 30. Each of the interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 may include a respective metallic liner (such as a layer of TiN, TaN, or WN having a thickness in a range from 2 nanometers (nm) to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described employing an embodiment in which the array 95 of non-volatile memory cells, such as TFT FeFET and/or FeRAM devices, may be formed as a component of a third interconnect-level structure L3, embodiments are expressly contemplated herein in which the array 95 of non-volatile memory cells may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells may be provided within multiple interconnect-level structures in the memory array region 50. While the present disclosure is described employing an embodiment in which an array 95 of non-volatile memory cells may be formed in a single interconnect-level structure, embodiments are expressly contemplated herein in which an array 95 of non-volatile memory cells may be formed over two vertically adjoining interconnect-level structures. Furthermore, embodiments are expressly contemplated herein in which an array 95 of non-volatile memory cells may be formed on or within the semiconductor material layer 10 (e.g., in a front-end-of-line (FEOL) operation).

Figure 5A:
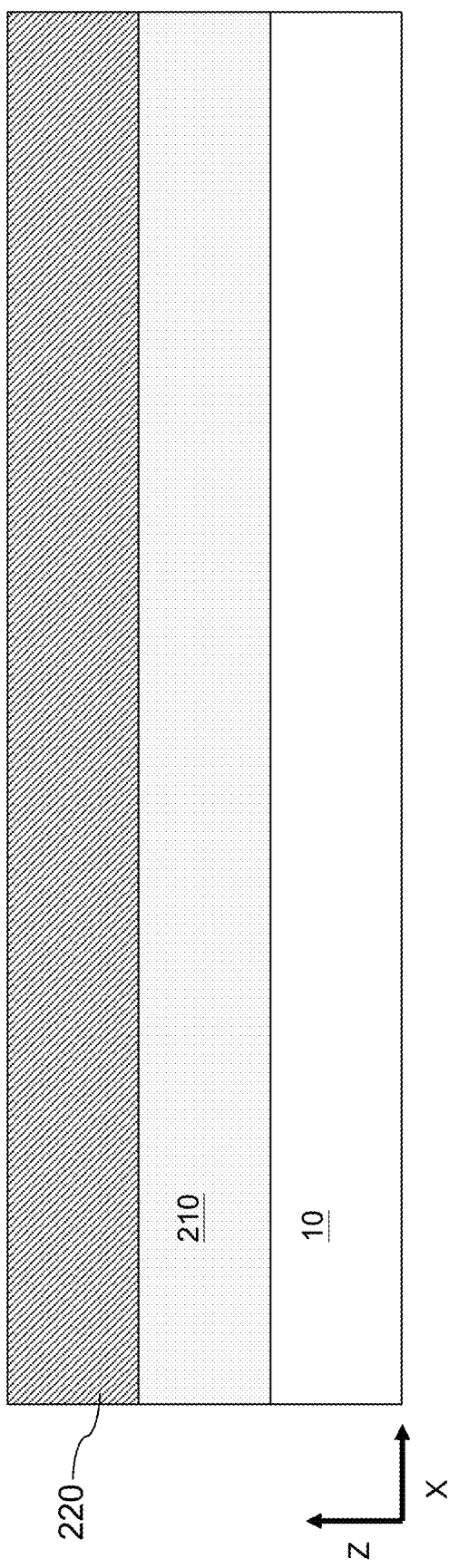
FIG. 5A is a vertical cross-sectional view of an exemplary intermediate structure during a process of forming a ferroelectric field effect transistor (FeFET) device showing a first dielectric layer over a substrate, and a bottom electrode layer over the first dielectric layer according to an embodiment of the present disclosure.

FIGS. 5A-5I are sequential vertical cross-sectional views of an exemplary structure during a process of forming a FeFET device, such as a TFT FeFET device, according to various embodiments of the present disclosure. The FeFET device may form a memory cell of an array 95 of memory cells such as shown in FIG. 1C. FIG. 5A illustrates a first dielectric layer 210 deposited over a substrate 10, and a bottom electrode layer 220 deposited over the first dielectric layer 210. Referring to FIG. 5A, the first dielectric layer 210 may be deposited over a suitable substrate 10, such as a semiconductor device substrate as shown in FIGS. 4A-4C. The substrate 10 may include control elements formed during FEOL processes. In some embodiments, one or more additional dielectric layers, such as ILD layers, may be deposited between the substrate 10 and the first dielectric layer 210. In such embodiments, the first dielectric layer 210 may be omitted. For example, ILD layer 33 discussed above with respect to FIGS. 4B and 4C may be deposited over or substituted for substrate 10.

The first dielectric layer 210 may be formed of any suitable dielectric material such as silicon oxide ($SiO_2$), or the like, or high-k dielectric materials such as silicon nitride ($Si_3N_4$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$), tantalum oxide ($Ta_2O_5$), aluminum oxide ($Al_2O_3$), hafnium dioxide-alumina ($HfO_2$—$Al_2O_3$), zirconium oxide ($ZrO_2$), or the like. In some embodiments, the first dielectric layer 210 may be a native oxide layer formed on the substrate 10. Other suitable dielectric materials may also be within the contemplated scope of disclosure.

The first dielectric layer 210 may be deposited using any suitable deposition process. Herein, suitable deposition processes may include chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like.

Referring again to FIG. 5A, a bottom electrode layer 220 may be deposited on the first dielectric layer 210. The bottom electrode layer 220 may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), alloys thereof, and combinations of the same. Other suitable materials for the bottom electrode layer 220 are within the contemplated scope of disclosure. In some embodiments, the material of the bottom electrode layer 220 may optionally have a lower coefficient of thermal expansion (CTE) than the CTE of a ferroelectric (FE) material layer that is subsequently formed over the bottom electrode layer 220. Utilizing a bottom electrode layer 220 having a lower CTE than the CTE of an overlying FE material layer may impart tensile stress on the FE material layer and improve ferroelectric properties of the FE material layer, as discussed in further detail below. In embodiments, the CTE of the material of the bottom electrode layer 220 may be less than $14 \times 10^{-6}$/K.

The bottom electrode layer 220 may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof. The thickness of the bottom electrode layer 220 may be in a range from 10 nm to 100 nm, although lesser and greater thicknesses may also be used.

Figure 5B:
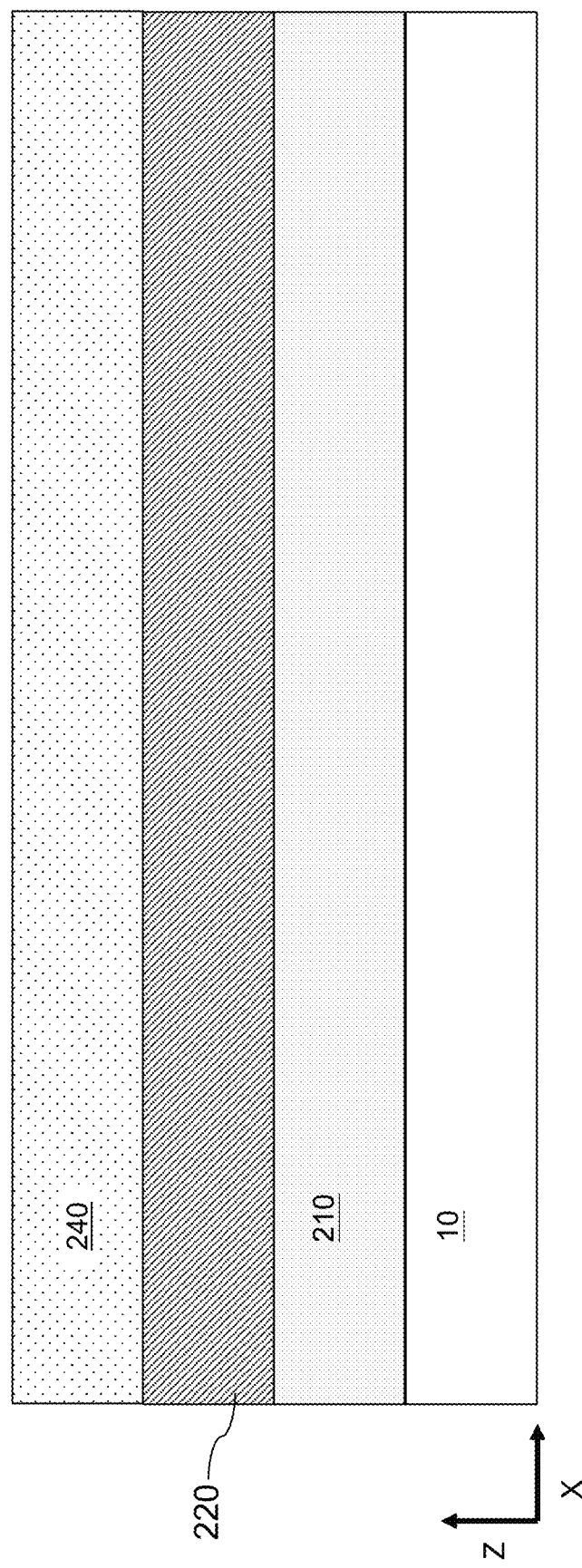
FIG. 5B is a vertical cross-section view of an exemplary intermediate structure during a process of forming a FeFET device showing a ferroelectric (FE) material layer deposited over the upper surface of the bottom electrode layer according to an embodiment of the present disclosure.

FIG. 5B is a vertical cross-section view of an exemplary intermediate structure during a process of forming a FeFET device showing a ferroelectric (FE) material layer 240 deposited over the upper surface of the bottom electrode layer 220. The FE material layer 240 may be formed of any suitable ferroelectric material. In various embodiments, the Fe material layer 240 may be hafnium oxide-based ferroelectric material, such as $Hf_xZr_{1-x}O_y$ where $0 \leq x \leq 1$ and $y>0$ (e.g., $Hf_{0.5}Zr_{0.5}O_2$), $HfO_2$, HfSiO, HfLaO, etc. In various embodiments, the FE material layer 240 may be hafnium zirconium oxide (HZO) doped with atoms having a smaller ionic radius than hafnium (e.g., Al, Si, etc.) and/or doped with atoms having a larger ionic radius than hafnium (e.g., La, Sc, Ca, Ba, Gd, Y, Sr, etc.). The dopant(s) may be at a concentration configured to improve a ferroelectric property of the FE material layer 240, such as increasing the remnant polarization. In various embodiments, dopants having a smaller ionic radius than hafnium and/or dopants having a larger ionic radius than hafnium may have a doping concentration that is between about 1 mol. % and about 20 mol. %. In some embodiments, the FE material of the FE material layer 240 may include oxygen vacancies. Oxygen vacancies in the FE material may promote the formation of orthorhombic (o-phase) crystal phases in the Fe material layer 240.

In some embodiments, the FE material of the FE material layer 240 may include AlN that is doped with Sc. Other suitable materials for the FE material layer 240 are within the contemplated scope of disclosure, including, without limitation, $ZrO_2$, $PbZrO_3$, $Pb[Zr_xTi_{1-x}]O_3$, ($0 \le x \le 1$) (PZT), $Pb_{1-x}La_xZr_{1-y}Ti_yO_3$ (PLZT), $BaTiO_3$, $PbTiO_3$, $PbNb_2O_6$, $LiNbO_3$, $LiTaO_3$, $PbMg_{1/3}Nb_{2/3}O_3$ (PMN), $PbSc_{1/2}Ta_{1/2}O_3$ (PST), $SrBi_2Ta_2O_9$ (SBT), $Bi_{1/2}Na_{1/2}TiO_3$, and combinations thereof.

In embodiments, the FE material layer 240 may include a single layer of FE material, or multiple layers of FE materials which may have different compositions. In various embodiments, the FE material layer 240 may have a crystal structure including cubic, tetragonal and/or orthorhombic crystal phases. In embodiments, the FE material layer 240 may include a hafnium oxide-based ferroelectric material, such as $Hf_xZr_{1-x}O_y$, and may have a structure such that a volume of the FE material having a cubic, tetragonal and/or orthorhombic crystal structure is more than 50% greater than a volume of the FE material having a monoclinic crystal structure.

The thickness of the FE material layer 240 along the z-axis direction may be in a range from 0.1 nm to 100 nm, although lesser and greater thicknesses may also be used. In various embodiments, the FE material layer 240 may be formed by an atomic layer deposition (ALD) process. The FE material layer 240 may be formed using a short pulse/purge ALD deposition sequence as described above, in which the pulse duration, $T_{pulse}$, of each precursor pulse is 1 second or less, such as 0.1-1 second, and the purge duration, $T_{purge}$, between successive precursor pulses is 3 seconds or less, such as between 2 and 3 seconds. Alternatively, the FE material layer 240 may be formed using a long pulse/purge ALD deposition sequence as described above, in which the pulse duration, $T_{pulse}$, of each precursor pulse is greater than 1 second, such as greater than 1 second and less than or equal to 5 seconds, and the purge duration, $T_{purge}$, between successive precursor pulses is greater than 3 seconds, such as greater than 3 seconds and less than or equal to 10 seconds. In some embodiments, the deposited FE material layer 240 may be subjected to an annealing process to improve the crystallinity of the FE material layer 240. The annealing process may include subjecting the FE material layer 240 to a temperature between 300° C. and 900° C. for between 1 second and 1 hour. In embodiments in which the FE material layer 240 is formed using a short pulse/purge process, the mean grain size of the FE material layer 240 may be 3 nm or less. In embodiments in which the FE material layer 240 is formed using a long pulse/purge process, the mean grain size of the FE material layer may be 7 nm or more, such as between 8 nm and 12 nm, and in some embodiments may be 10 nm or more.

In some embodiments, when the total thickness of the FE material layer 240 along the z-axis direction is greater than a threshold thickness, the FE material layer 240 may be deposited using a short pulse/purge ALD deposition sequence as described above. In some embodiments, when the total thickness of the FE material layer 240 along the z-axis direction is less than or equal to the threshold thickness, the FE material layer 240 may be deposited using a long pulse/purge ALD deposition sequence as described above. In various embodiments, the threshold thickness may be in a range between 5 nm and 15 nm, such as between 8 nm and 12 nm, including about 10 nm.

In various embodiments, the FE material layer 240 may optionally be under a tensile strain in a direction that is parallel to the top and/or bottom surfaces of the FE material layer 240. In embodiments, the FE material layer 240 may be subject to a tensile strain of between 1.5% and 3.0% over at least a portion of the FE material layer 240. As discussed above, subjecting the FE material layer 240 to a tensile strain may promote the formation and stability of crystal structures, such as orthorhombic crystal phases, that may increase the ferroelectric properties of the material, relative to other structures such as monoclinic crystal phases that may degrade the ferroelectric properties of the material. In various embodiments, tensile strain on the FE material layer 240 may be induced, at least in part, by a mismatch of the coefficient of thermal expansion (CTE) between the bottom electrode layer 220 and the FE material layer 240. As discussed above, in various embodiments the material of the bottom electrode layer 220 may have a lower CTE than the CTE of the material of the FE layer 240. For example, in embodiments in which the FE material layer 240 includes hafnium zirconium oxide (HZO), which has a CTE of $14 \times 10^{-6}$/K, the bottom electrode layer 220 may include material(s) having a CTE that is less than $14 \times 10^{-6}$/K. Suitable electrically conductive materials having a comparatively lower CTE include, without limitation, platinum (Pt), titanium (Ti), titanium nitride (TiN), tungsten (W), tantalum (Ta), tantalum nitride (TaN), iron (Fe), nickel (Ni), beryllium (Be), chromium (Cr), cobalt (Co), antimony (Sb), iridium (Ir), molybdenum (Mo), osmium (Os), thorium (Th), vanadium (V), alloys thereof, and combinations of the same. In various embodiments, tensile strain may be induced in the FE material layer 240 by subjecting the intermediate structure shown in FIG. 5B to an annealing process, such as the above-described annealing process for improving the crystallinity of the FE material layer 240, which may include annealing the intermediate structure at a temperature between 300° C. and 900° C. for between 1 second and 1 hour, followed by a cool down period. During the cool down period, the FE material layer 240 may shrink to a greater extent than the bottom electrode 220 due to the differential in CTE. This may stretch the FE material layer 240 in a direction that is parallel to the top and/or bottom surfaces of the FE material layer 240 and thus subject the FE material layer 240 to a permanent tensile strain.

Figure 5C:
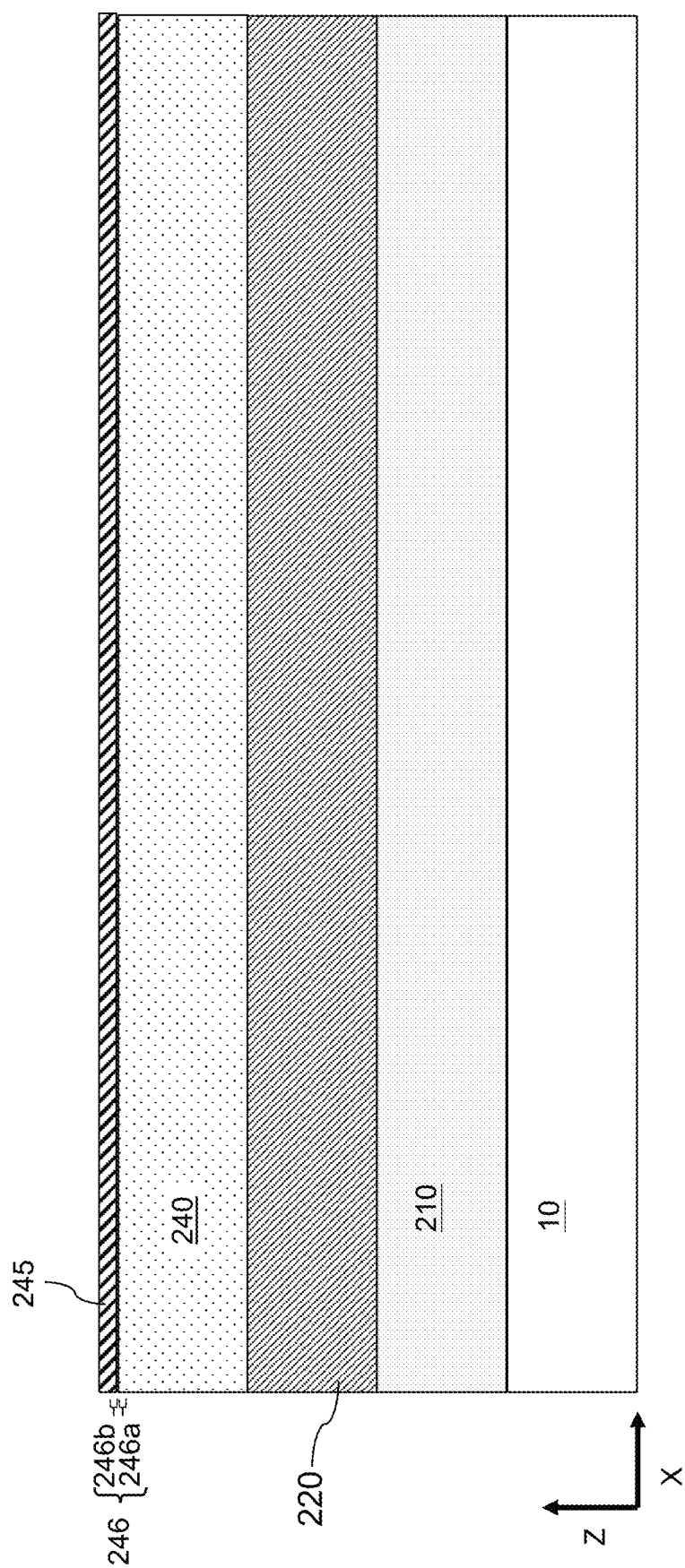
FIG. 5C is a vertical cross-section view of an exemplary intermediate structure during a process of forming a FeFET device showing an optional insulating layer deposited over the upper surface of the FE material layer according to an embodiment of the present disclosure.

FIG. 5C is a vertical cross-section view of an exemplary intermediate structure during a process of forming a FeFET device showing an optional insulating layer 245 deposited over the upper surface of the FE material layer 240. Referring to FIG. 5C, the optional insulating layer 245 (also referred to as a "blocking" layer) may include a layer of dielectric material, such as a high-k dielectric material. Herein, high-k dielectric materials have a dielectric constant greater than 3.9 and may include, but are not limited to, hafnium oxide ($HfO_2$), hafnium silicon oxide ($HfSiO_4$), zirconium silicate ($ZrSiO_4$) hafnium tantalum oxide (HfTaO), hafnium titanium oxide (HfTiO), hafnium zirconium oxide ($Hf_xZr_{x-1}O_y$) (HZO)), silicon nitride ($SiN_x$), tantalum oxide ($Ta_2O_5$), aluminum oxide ($Al_2O_3$), lanthanum aluminate ($LaAlO_3$), hafnium dioxide-alumina ($HfO_2$—$Al_2O_3$), zirconium oxide ($ZrO_2$), magnesium oxide (MgO), yttrium oxide ($Y_2O_3$), lanthanum oxide ($La_2O_3$), strontium oxide (SrO), gadolinium oxide ($Gd_2O_3$), calcium oxide (CaO), scandium oxide ($Sc_2O_3$), combinations thereof, or the like. In embodiments, the optional insulating layer 245 may include Si, Mg, Al, $Y_2O_3$, La, Sr, Gd, N, Sc, Ca etc., including any combination compound of Si, Mg, Al, $Y_2O_3$, La, Sr, Gd, N, Sc, Ca etc. Other suitable dielectric materials are within the scope of the present disclosure.

The optional insulating layer 245 may be deposited using any suitable deposition processes, as described above. In various embodiments, the optional insulating layer 245 may be deposited using atomic layer deposition (ALD). The thickness of the optional insulating layer 245 may be in a range from 0.1 nm to 10 nm, although lesser and greater thicknesses may also be used.

The optional insulating layer 245 may function as a barrier between the FE material layer 240 and a semiconductor channel layer that may be subsequently formed over the insulating layer 245. The optional insulating layer 245 may help to reduce surface state density ($D_{it}$) and inhibit carrier (i.e., electron and/or hole) injection from the semiconductor channel layer. In various embodiments, the material of the optional insulating layer 245 may have a higher band gap ($E_g$) than the band gap of the subsequently-formed semiconductor channel layer. For example, where the subsequently formed semiconductor channel layer is amorphous InGaZnO$_4$ (a-IGZO), having a band gap $E_g$ of ~3.16 eV, the material of the optional insulating layer 245 may have a larger band gap (e.g., $E_g \geq 3.5$ eV, such as $E_g \geq 5.0$ eV). Further, the conduction band offset ($E_{CBO}$) and the valence band offset ($E_{VBO}$) between the material of the insulating layer 245 and the semiconductor channel layer may be sufficiently large (e.g., $E_{CBO} > 1$ eV, $E_{VBO} > 1$ eV) to block charge carriers, including both electrons and holes, from being injected into the insulating layer 245 and thereby minimize current leakage from the semiconductor channel layer. In various embodiments, the optional insulating layer 245 may include silicon-doped hafnium oxide, such as $Hf_{1-x}Si_xO_y$, where x>0.1 and y>0.

In some embodiments, the FE material layer 240 may include hafnium zirconium oxide (HZO) and the optional insulating layer 245 may include a hafnium-containing dielectric material, such as silicon-doped hafnium oxide. An interface region 246 adjacent to the interface between the FE material layer 240 and the optional insulating layer 245 may include a first interface region portion 246a located within the FE material layer 240, and a second interface region portion 246b, adjacent to the first interface region portion 246a, located within the optional insulating layer 245. Each of the first interface region portion 246a and the second interface region portion 246b may have a thickness of at least 1 nm. In various embodiments, within the interface region 246, a ratio of the atomic percentage of oxygen to the atomic percentage of zirconium may be ≥1, and a ratio of the atomic percentage of oxygen to the atomic percentage of hafnium may be >1.

Figure 5D:
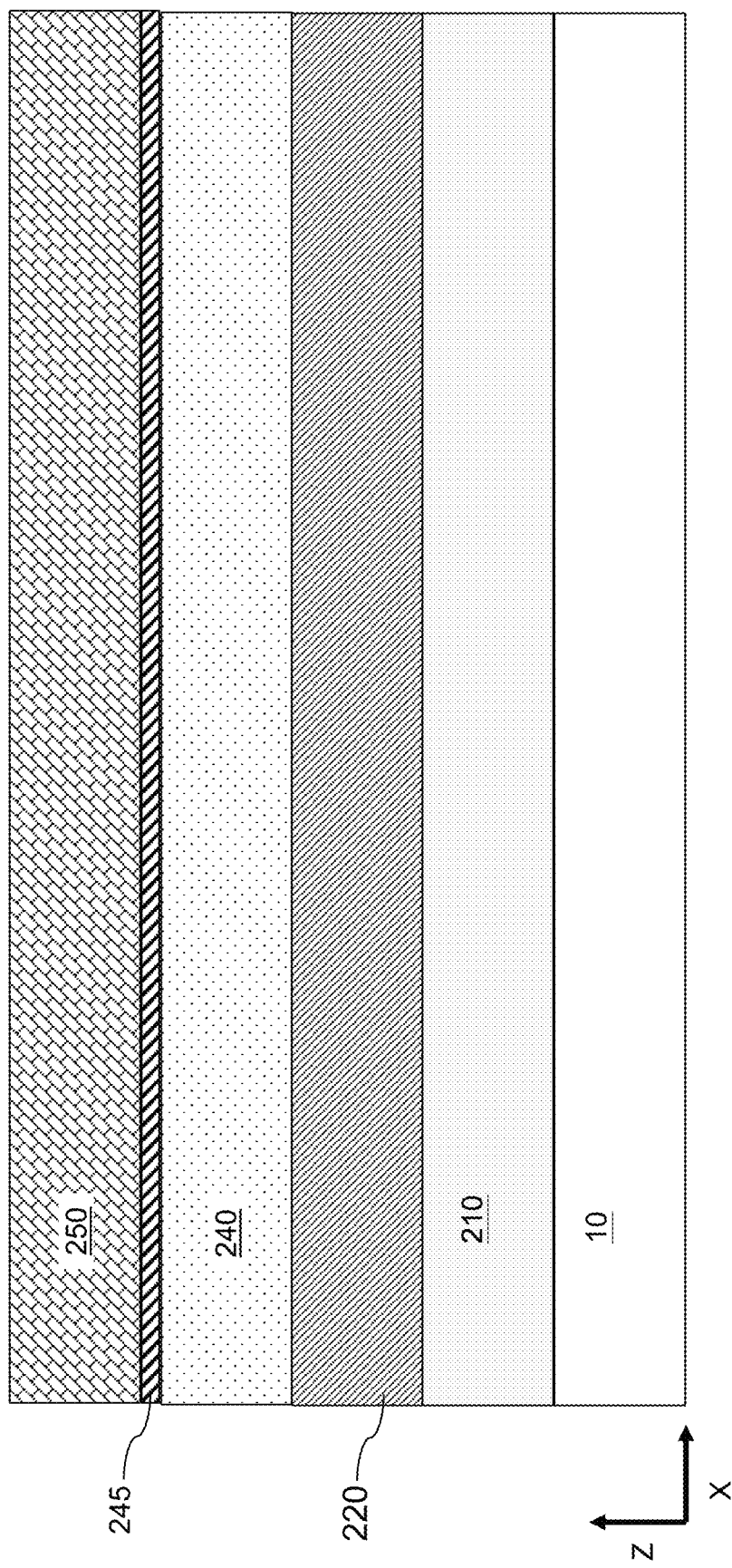
FIG. 5D is a vertical cross-section view of an exemplary intermediate structure during a process of forming a FeFET device showing a channel layer deposited over the upper surface of optional insulating layer according to an embodiment of the present disclosure.

FIG. 5D is a vertical cross-section view of an exemplary intermediate structure during a process of forming a FeFET device showing a channel layer 250 deposited over the upper surface of optional insulating layer 245. In embodiments in which the optional insulating layer 245 is not present, the channel layer 250 may be deposited over the upper surface of the FE material layer 240. The channel layer may be composed of a suitable semiconductor material, such as an oxide semiconductor material (e.g., amorphous indium gallium zinc oxide, or "a-IGZO"), silicon, silicon germanium, a III-V semiconductor material (e.g., GaAs, GaAsIn, etc.), and/or a II-VI semiconductor material (e.g., ZnO, MgO, GdO, etc.). Other suitable semiconductor materials are within the contemplated scope of disclosure.

In various embodiments, the channel layer 250 may be composed of an oxide semiconductor material, such as $M_xM'_yZn_zO$. where 0<(x, y, z)<1. M may be a metal selected from the group consisting of indium (In) and tin (Sn) or combinations thereof, and M' may be a metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd) or combinations thereof. In some embodiments, the channel layer 250 may be amorphous indium gallium zinc oxide (a-IGZO). In other embodiments, indium may be partially or fully substituted by another metal, such as tin (Sn), that may be configured to provide high carrier mobility within the channel layer 250. Alternatively, or in addition, gallium may be partially or fully substituted by another metal, such as one or more of hafnium (Hf), zirconium (Zr), titanium (Ti), aluminum (Al), strontium (Sr), barium (Ba), scandium (Sc), magnesium (Mg), lanthanum (La), or gadolinium (Gd), that may be configured to reduce oxygen vacancies and lower surface states ($D_{it}$).

In various embodiments, the channel layer 250 may have a thickness between 0.1 and 100 nm (e.g., between 1 nm and 70 nm), although greater or lesser thicknesses may be used. The channel layer 250 may be deposited using a suitable deposition process as described above. In various embodiments, the channel layer 250 may be deposited using atomic layer deposition (ALD).

Figure 5E:
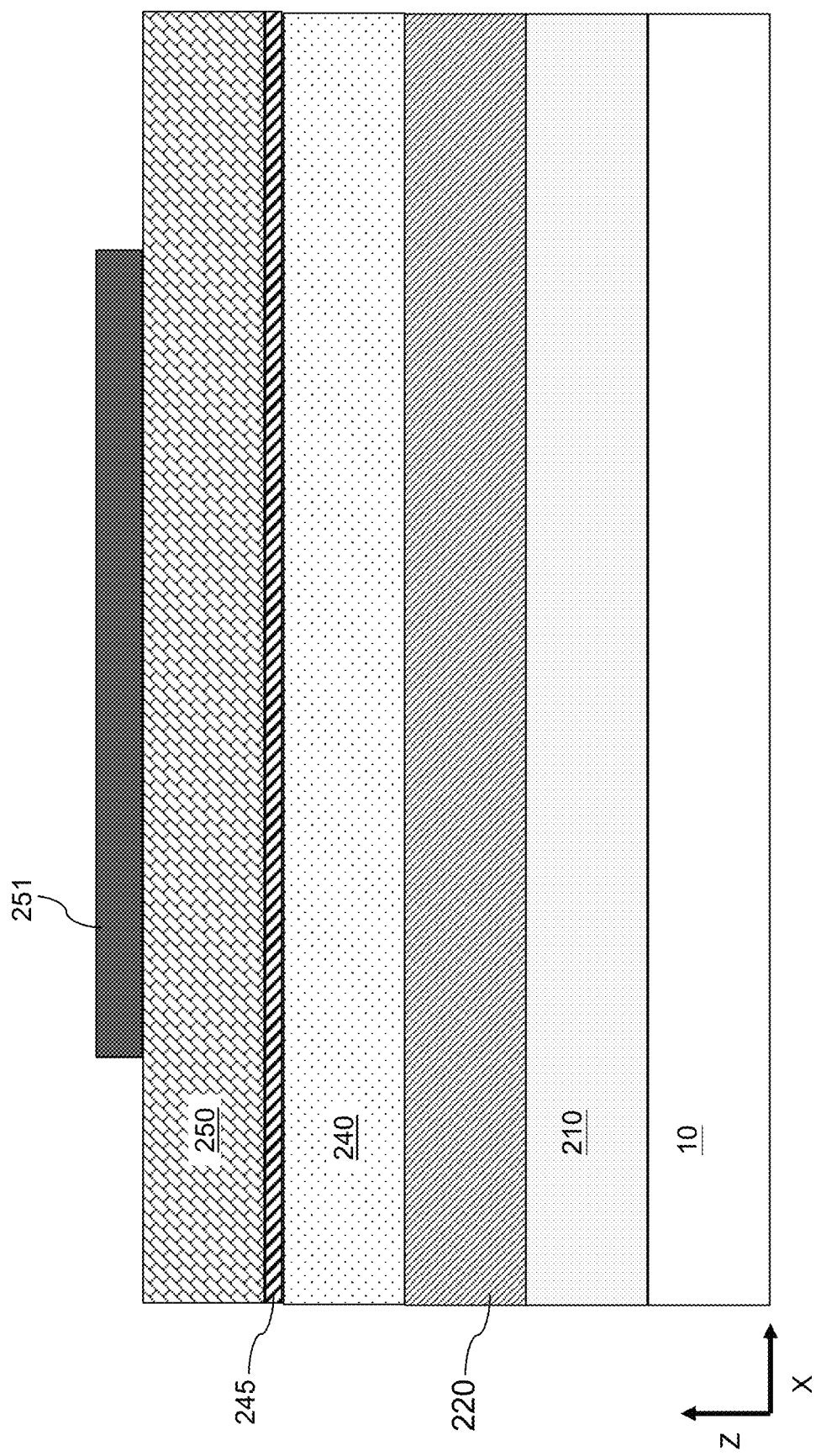
FIG. 5E is a vertical cross-section view of an exemplary intermediate structure during a process of forming a FeFET device showing a patterned mask over the upper surface of the channel layer according to an embodiment of the present disclosure.

FIG. 5E is a vertical cross-section view of an exemplary intermediate structure during a process of forming a FeFET device showing a patterned mask 251 over the upper surface of the channel layer 250. The patterned mask 251 may be patterned using photolithography to remove portions of the mask material and expose portions of the upper surface of the channel layer 250.

FIG. 5F is a vertical cross-section view of an exemplary intermediate structure during a process of forming a FeFET device following an etching process that forms a multilayer structure 255 over the first dielectric material layer 210. Referring to FIG. 5F, an etching process may be performed through the patterned mask 251 to remove portions of the channel layer 250, the optional insulating layer 245, the FE material layer 240, and the bottom electrode layer 220. Following the etching process, the remaining portions of the channel layer 250, the optional insulating layer 245, the FE material layer 240, and the bottom electrode layer 220 may form a multilayer structure 255. In some embodiments, the etching process may produce a plurality of discrete multilayer structures 255 over the first dielectric material layer 210. The upper surface of the first dielectric material layer 210 may be exposed between respective multilayer structures 255. Following the etching process, the patterned mask 251 may be removed using a suitable process, such as by ashing or by dissolution with a solvent.

Figure 5G:
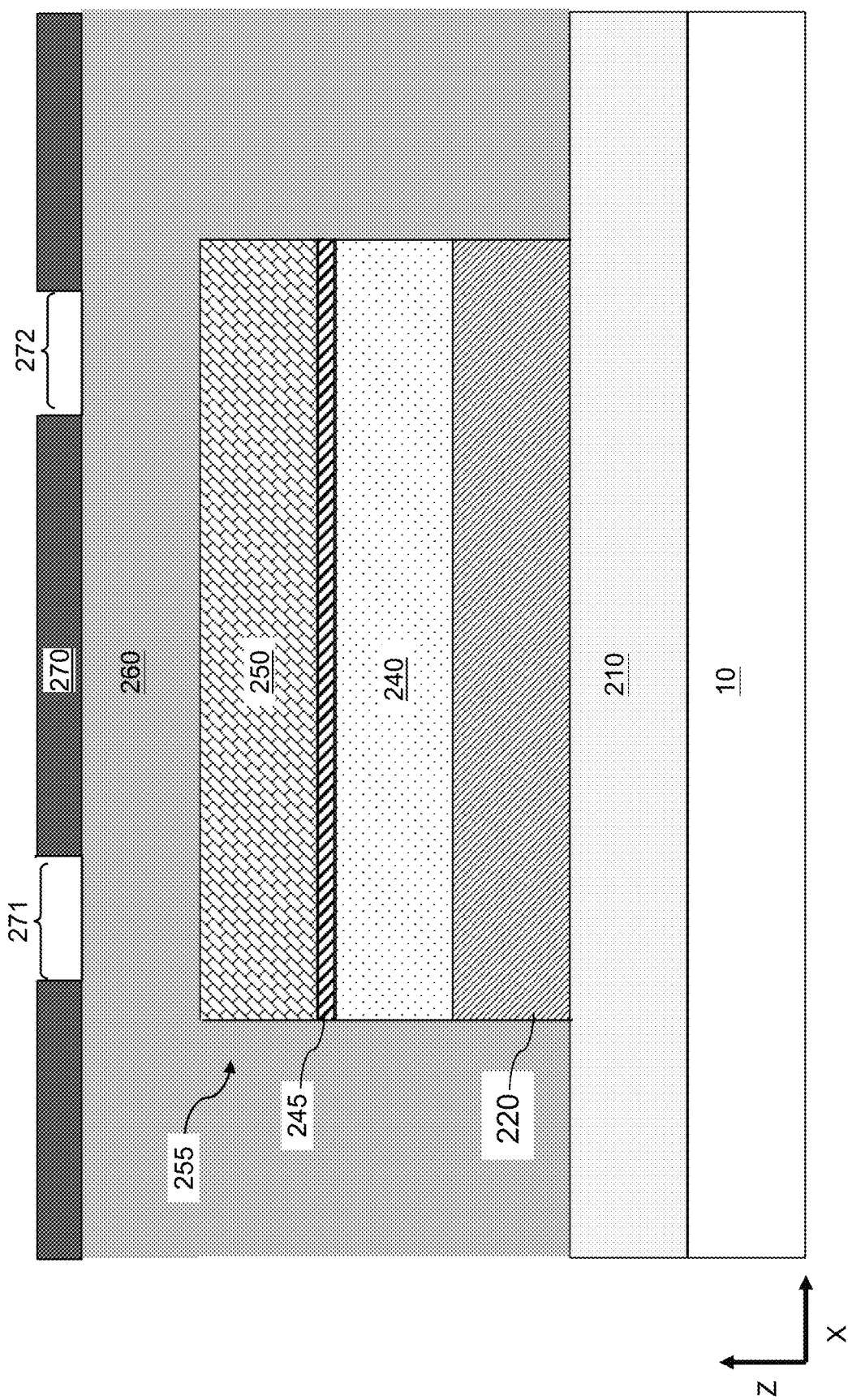
FIG. 5G is a vertical cross-section view of an exemplary intermediate structure during a process of forming a FeFET device that includes a second dielectric material layer formed over the upper surface and side surfaces of the multilayer structure and over the exposed upper surface of the first dielectric material layer according to an embodiment of the present disclosure.

FIG. 5G is a vertical cross-section view of an exemplary intermediate structure during a process of forming a FeFET device that includes a second dielectric material layer 260 formed over the upper surface and side surfaces of the multilayer structure 255 and over the exposed upper surface of the first dielectric material layer 210. The second dielectric material layer 260 may be composed of a suitable dielectric material, such as silicon oxide, aluminum oxide, etc. Other materials are within the contemplated scope of disclosure. In some embodiments, the second dielectric material layer 260 may be a low-k dielectric material. The dielectric material layer 260 may be deposited using a suitable deposition method as described above.

Referring again to FIG. 5G, a patterned mask 270 may be formed over the upper surface of the second dielectric material layer 260. The patterned mask 270 may be patterned using photolithography to remove portions of the mask material and expose regions 271 and 272 of the upper surface of second dielectric material layer 260. The exposed regions 271 and 272 of the second dielectric material layer 260 may correspond to the locations of source and drain regions, respectively, that may be subsequently formed in the multilayer structure 255.

Figure 5H:
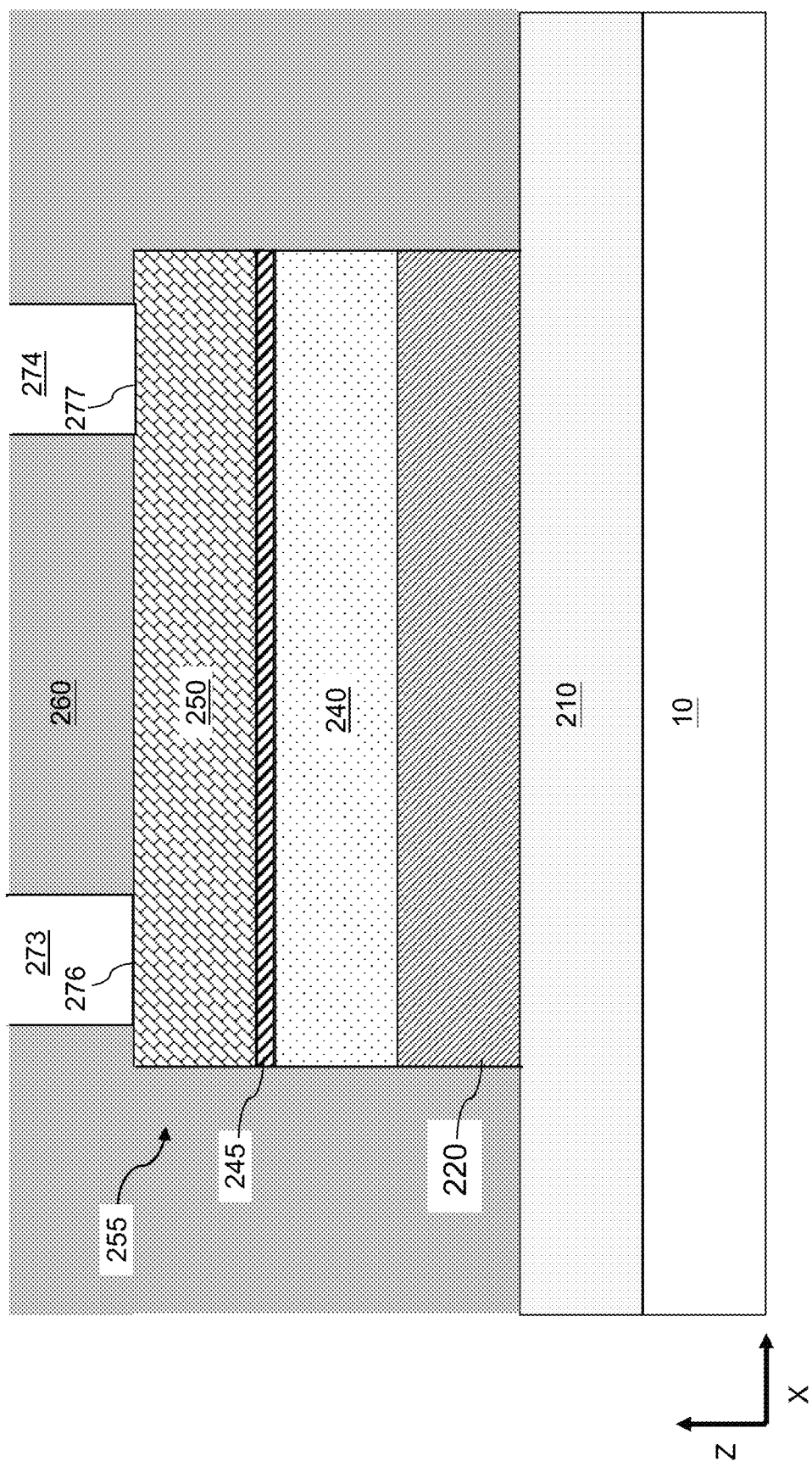
FIG. 5H is a vertical cross-section view of an exemplary intermediate structure during a process of forming a FeFET device showing openings formed through the second dielectric material layer to expose the upper surface of the channel layer according to an embodiment of the present disclosure.

FIG. 5H is a vertical cross-section view of an exemplary intermediate structure during a process of forming a FeFET device showing openings 273 and 274 formed through the second dielectric material layer 260 to expose the upper surface of the channel layer 250. Referring to FIG. 5H, the exemplary intermediate structure may be etched through the patterned mask 270 to remove portions of the second dielectric material layer 260 and expose the upper surface of the channel layer 250 in the bottom of openings 273 and 274. The regions of the channel layer 250 exposed through the openings 273 and 274 may correspond to source and drain regions 276, 277, respectively, of the FeFET device. Following the etching process, the patterned mask 270 may be removed using a suitable process, such as by ashing or by dissolution using a solvent.

In some embodiments, the source region 276 and drain region 277 of the channel layer 250 may be subjected to a plasma treatment through the openings 273 and 274 in the second dielectric material layer 260. In embodiments, the plasma treatment may be a helium (He) plasma treatment. The plasma treatment of the source and drain regions 276 and 277 of the channel layer 250 may be conducted for between 5 seconds and 5 minutes, such as between 30 and 120 seconds (e.g., ~60 seconds). The plasma treatment may be conducted with a power density that is greater than 0.3 W/cm2, such as between 0.8 and 1.2 W/cm2 (e.g., ~0.98 W/cm2). The plasma treatment may lower the contact resistance at the source region 276 and drain region 277. In various embodiments, such as where the channel layer 250 is composed of an oxide semiconductor material (e.g., a-IGZO), the plasma treatment may also produce regions of the channel layer 250 underlying the source region 276 and drain region 277 that may be comparatively rich in oxygen vacancies. The oxygen-vacancy rich regions of the channel layer 250 may reduce the source-gate and drain-gate resistance of the channel layer 250.

Figure 5I:
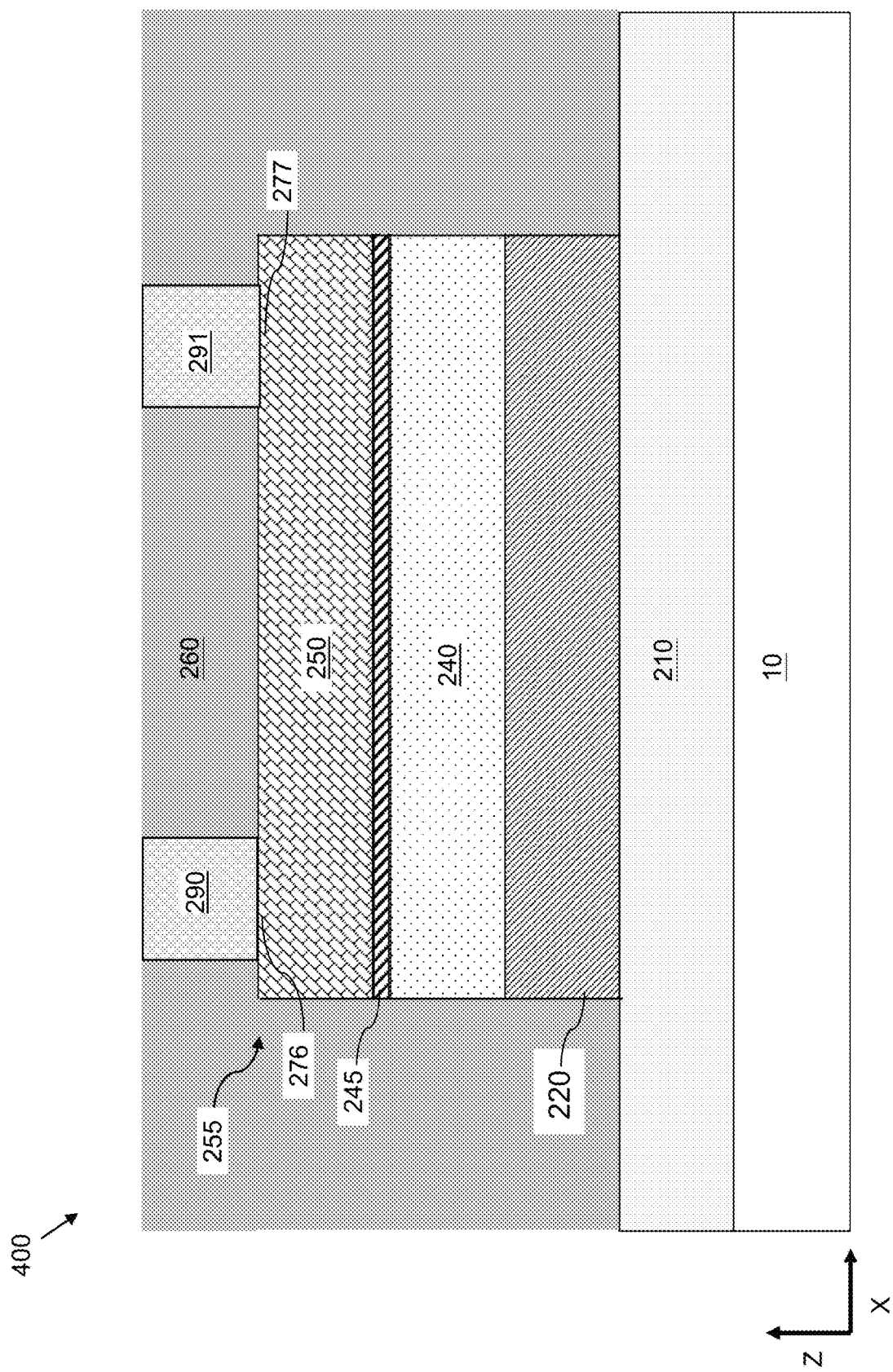
FIG. 5I is a vertical cross-section view of a FeFET device including source and drain electrodes formed over the source region and drain region of the channel layer according to an embodiment of the present disclosure.

FIG. 5I is a vertical cross-section view of a FeFET device 400 including source electrode 290 and drain electrode 291 formed over the source region 276 and drain region 277 of the channel layer 250. Referring to FIG. 5I, the source electrode 290 and drain electrode 291 may include any suitable electrically conductive material, such as titanium nitride (TiN), molybdenum (Mo), copper (Cu), aluminum (Al), zirconium (Zr), titanium (Ti), tungsten (W), tantalum (Ta), tantalum nitride (TaN), ruthenium (Ru), palladium (Pd), platinum (Pt), cobalt (Co), nickel (Ni), iridium (Ir), iron (Fe), beryllium (Be), chromium (Cr), antimony (Sb), osmium (Os), thorium (Th), vanadium (V), alloys thereof, and combinations of the same. Other suitable electrode materials are within the scope of disclosure. The source and drain electrodes 290 and 291 may electrically contact the source region 276 and drain region 277, respectively, of the channel layer 250. The source electrode 290 and drain electrode 291 may be deposited using any suitable deposition method, such as physical vapor deposition (PVD), sputtering, chemical vapor deposition (CVD), atomic layer deposition (ALD), plasma-enhanced chemical vapor deposition (PECVD), or combinations thereof. In various embodiments, the source electrode 290 and drain electrode 291 may be formed by depositing a layer of an electrically conductive material over the upper surfaces of the second dielectric material layer 260 and within the openings 273, 274 through the second dielectric material layer 260. Then, a planarization process, such as a chemical mechanical planarization (CMP) process, may be used to remove portions of the electrically conductive material from above the upper surface of the second dielectric material layer 260 and provide discrete source and drain electrodes 290 and 291 contacting the upper surface of the channel layer 250. In embodiments, the upper surfaces of the source and drain electrodes 290 and 291 may be co-planar with the upper surface of the second dielectric material layer 260. In embodiments, the source electrode 290 and drain electrode 291 may have a thickness between lower and upper surfaces of the source electrode 290 and drain electrode 291 that is between about 50 nm and about 1000 nm.

The FeFET device 400 shown in FIG. 5I may include a FE material layer 240, such as a hafnium zirconium oxide (HZO) layer, located between a semiconductor channel layer 250, which may be an oxide semiconductor material (e.g., a-IGZO), and a bottom electrode layer 220, which may also be referred to as a "bottom gate electrode" or a "back gate electrode." Source and drain electrodes 290 and 291 may contact a surface of the semiconductor channel layer 250. In some embodiments, a mean grain size of the FE material layer 240 may be 7 nm or more, such as between 8 nm and 12 nm, and in some embodiments may be 10 nm or more.

Figure 6:
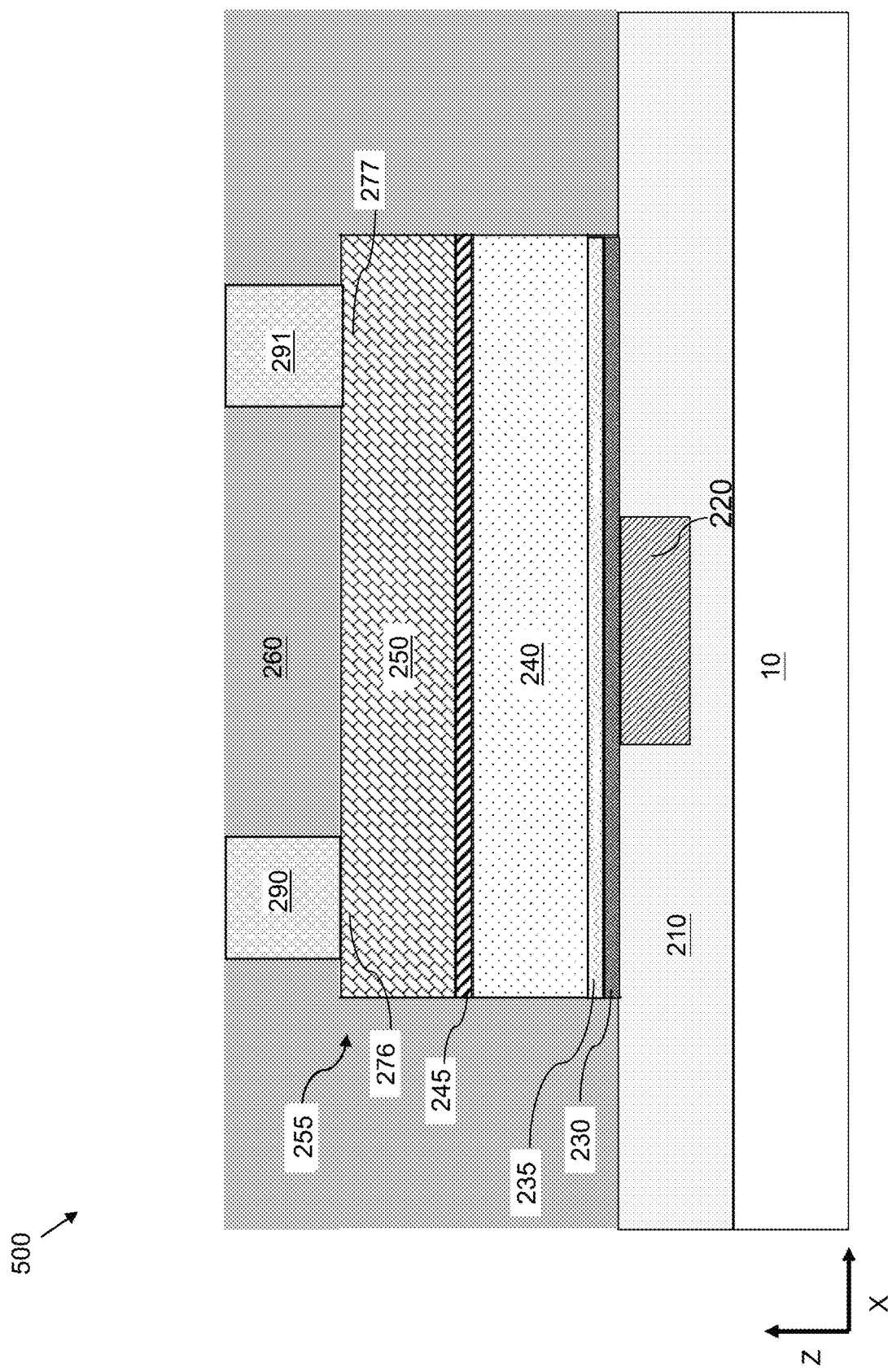
FIG. 6 is a vertical cross-section view of an alternative exemplary structure of a FeFET device including a buried gate electrode embedded in the first dielectric material layer, a stress layer located over an upper surface of the buried gate electrode and the first dielectric material layer, and a seed layer located over an upper surface of the stress layer according to an embodiment of the present disclosure.

FIG. 6 is a vertical cross-section view of an alternative exemplary structure of a FeFET device 500 including a buried gate electrode 220 embedded in the first dielectric material layer 220, a stress layer 230 located over an upper surface of the buried gate electrode 220 and the first dielectric material layer 210, and a seed layer 235 located over an upper surface of the stress layer 230. Referring to FIG. 6, a buried gate electrode 220 is shown embedded in the first dielectric layer 210. The buried gate electrode 220 may be formed by forming a photoresist layer (not shown) over the surface of the first dielectric layer 210 and patterning the photoresist layer using photolithographic techniques. The pattern of the photoresist layer may be transferred to the first dielectric layer 210 via an etching process performed through the patterned photoresist layer and thus, the first dielectric material layer 210 may be patterned to include one or more trenches. An electrically conductive material may be deposited in the one or more trenches using a suitable deposition process as described above, and a planarization process may be performed to remove electrically conductive material from above the upper surface of the first dielectric material layer 210, thereby providing one or more discrete buried gate electrodes 220 embedded within the first dielectric material layer 210.

Alternatively, a continuous electrode layer, such as the bottom gate electrode layer 220 shown in FIG. 5A, may be deposited on the upper surface of the first dielectric material layer 210 using a suitable deposition process as described above. Selected portions of the continuous electrode layer may be removed (e.g., by etching the continuous electrode layer through a patterned mask formed using photolithographic processes) to form one or more discrete patterned electrode layers on the first dielectric material layer 210. Then, additional dielectric material may be formed over the exposed surfaces of the first dielectric layer 210, the side surfaces of the patterned electrode layer(s), and optionally over the upper surface(s) of the patterned electrode layer(s). A planarization process may then be performed to planarize the upper surfaces of the patterned electrode layer(s) and the first dielectric material layer 210 to provide one or more discrete buried gate electrodes 220 embedded in the first dielectric material layer 210.

In other embodiments, a buried gate electrode 220 may be embedded in a semiconductor material layer, such as semiconductor material layer 10 shown in FIGS. 4A-4C.

The buried gate electrode 220 may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), alloys thereof, and combinations of the same. Other suitable electrically conductive materials for the buried gate electrode 220 are within the contemplated scope of disclosure. In some embodiments, the material of the buried gate electrode 220 may optionally have a lower coefficient of thermal expansion (CTE) than the CTE of the ferroelectric (FE) material layer 240 that is subsequently formed over the buried gate electrode 220. As discussed above with reference to the embodiment shown in FIGS. 5A-5I, utilizing a gate electrode 220 having a lower CTE than the CTE of an overlying FE material layer may impart tensile stress on the FE material layer 240 and improve ferroelectric properties of the FE material layer. In embodiments, the FE material layer 240 may include hafnium zirconium oxide (HZO), which has a CTE of $14 \times 10^{-6}$/K, and the buried gate electrode 220 may include material(s) having a CTE that is less than $14 \times 10^{-6}$/K.

Referring again to FIG. 6, an optional stress layer 230 may be deposited over the upper surfaces of the buried gate electrode 220 and the first dielectric material layer 210. The optional stress layer 230 may include a metal oxide material that may function as a buffer layer for the FE material layer 240 that is subsequently formed over the optional stress layer 230. The optional stress layer 230 may be a material having a lattice mismatch with the ferroelectric material of the FE material layer 240 such that a tensile strain is induced in the FE material layer 240. It is known that in many FE materials, such as hafnium zirconium oxide, small changes in the lattice parameters may result in a larger portion of the FE material having a desirable crystalline phase, such as an orthorhombic crystal phase, relative to other crystal phases, such as a monoclinic crystal phase. Tensile strain due to lattice mismatch between the stress layer 230 and the FE material layer 240 may provide a FE layer having improved ferroelectric properties, such as increased remnant polarization, Pr.

The optional stress layer 230 may include a metal oxide material such as $Ta_2O_5$, $K_2O$, $Rb_2O$, SrO, BaO, $a-V_2O_3$, $a-Cr_2O_3$, $a-Ga_2O_3$, $a-Fe_2O_3$, $a-Ti_2O_3$, $a-In_2O_3$, $YAlO_3$, $Bi_2O_3$, $Yb_2O_3$, $Dy_2O_3$, $Gd_2O_3$, $SrTiO_3$, $DyScO_3$, $TbScO_3$, $GdScO_3$, $NdScO_3$, $NdGaO_3$, $LaSrAlTaO_3$ (LSAT), and combinations of the same. In various embodiments, the stress layer 230 may include a multi-layer structure, including at least one layer comprised of $LaSrMnO_3$ (LMSO). For example, the stress layer 230 may include a bi-layer structure such as $LSMO/SrTiO_3$, $LSMO/DyScO_3$, $LSMO/TbScO_3$, $LSMO/GdScO_3$, $LSMO/NdScO_3$, $LSMO/NdGaO_3$, and LSMO/LSAT. Other suitable materials for the stress layer 230 are within the contemplated scope of disclosure. In various embodiments, the lattice constant $a_0$ of the optional stress layer 230 may be larger than the in-plane lattice constant of the material of the FE material layer 240 in order to induce tensile strain in the FE material layer 240.

The optional stress layer 230 may be deposited using any suitable deposition process. In various embodiments, the optional stress layer 230 may be deposited using atomic layer deposition (ALD) or pulsed laser deposition (PLD). In some embodiments, the optional stress layer 230 may be thermally annealed for 30 seconds to 10 minutes at temperatures between 300° C. and 700° C. to increase the crystallinity of the stress layer 230. Longer or shorter annealing times as well as higher or lower annealing temperatures may also be used. Alternatively or in addition, the stress layer 230 may be deposited as a quasi-single crystal metal oxide material using a suitable deposition technique (e.g., PLD). The thickness of the optional stress layer 230 may be in a range from 0.5 nm to 5 nm, although lesser and greater thicknesses may also be used.

In various embodiments, the FE material layer 240 of the FeFET structure 500 shown in FIG. 6 may be subject to a tensile strain of between 1.5% and 3.0% over at least a portion of the FE material layer 240. As discussed above, subjecting the FE material layer 240 to a tensile strain may promote the formation and stability of crystal structures, such as orthorhombic crystal phases, that may increase the ferroelectric properties of the material, relative to other structures such as monoclinic crystal phases that may degrade the ferroelectric properties of the material. In various embodiments in which an optional stress layer 230 is present, tensile strain on the FE material layer 240 may be induced, at least in part, by a lattice mismatch between the stress layer 230 and the FE material layer 240. Alternatively, or in addition, tensile strain on the FE material layer 240 may be induced, at least in part, by a mismatch of the coefficient of thermal expansion (CTE) between the buried gate electrode 220 and the FE material layer 240.

Referring again to FIG. 6, an optional seed layer 235 may be deposited over the upper surface of the optional stress layer 230. In embodiments in which the optional stress layer 230 is not present, the optional seed layer 235 may be deposited over the upper surfaces of the buried gate electrode 220 and the first dielectric material layer 210. The optional seed layer 235 (also referred to as a ferroelectrical promotional layer) may include a material configured to promote the formation of a desired crystal structure in a FE material layer 240 that is subsequently formed thereon. For example, the seed layer 235 may promote the formation of cubic (c-phase), tetragonal (t-phase) and/or orthorhombic (o-phase) crystal phases relative to monoclinic crystal phases (m-phase) in the subsequently-formed FE material layer, and may also inhibit the transformation of t-phase crystal structures to m-phase crystal structures in the FE material layer. This may result in an FE material layer having improved ferroelectric properties, such as increased remnant polarization, Pr.

In various embodiments, the optional seed layer 235 may be a metal oxide material, such as zirconium oxide (ZrO2), zirconium-yttrium oxide (ZrO2-Y2O3), hafnium oxide (HfO2), aluminum oxide (Al2O3), and hafnium zirconium oxide (HfxZr1-xO2, where 0≤x≤1), and combinations of the same. Other suitable materials for the seed layer 235 are within the contemplated scope of disclosure. The seed layer 235 may include a single layer of metal oxide material, or multiple layers of metal oxide materials which may have different compositions. In various embodiments, the seed layer material may have a crystal structure including cubic, tetragonal and/or orthorhombic crystal phases.

The optional seed layer 235 may be deposited using any suitable deposition process. In various embodiments, the optional seed layer 235 may be deposited using atomic layer deposition (ALD) or pulsed laser deposition (PLD). In some embodiments, the optional seed layer 235 may be thermally annealed for 30 seconds to 10 minutes at temperatures between 300° C. and 700° C. to increase the crystallinity of the seed layer 235. In embodiments in which an optional stress layer 230 is present, the stress layer 230 and the seed layer 235 may be annealed at the same time or may be annealed in separate annealing steps. Alternatively or in addition, the seed layer 235 may be deposited as a quasi-single crystal metal oxide material using a suitable deposition technique (e.g., PLD). The thickness of the optional seed layer 235 may be in a range from 0.1 nm to 5 nm, although lesser and greater thicknesses may also be used.

Following the deposition of the optional seed layer 235, the process steps described above with reference to FIGS. 5B-5I may be performed to provide a FeFET device 500 as shown in FIG. 6. In some embodiments, following the deposition of the FE material layer 240, and additional seed layer (not shown in FIG. 6) may be deposited over the upper surface of the FE material layer 240. The optional insulating layer 245 may be deposited over the upper surface of the additional seed layer. In embodiments in which the optional insulating layer 245 is not present, the channel layer 250 may be deposited over the upper surface of the additional seed layer. The additional seed layer may have the same or similar composition and structure as optional seed layer 235 described above. The additional seed layer may include a material configured to promote the formation and maintenance of a desired crystal structure in the underlying FE material layer 240.

Figure 7:
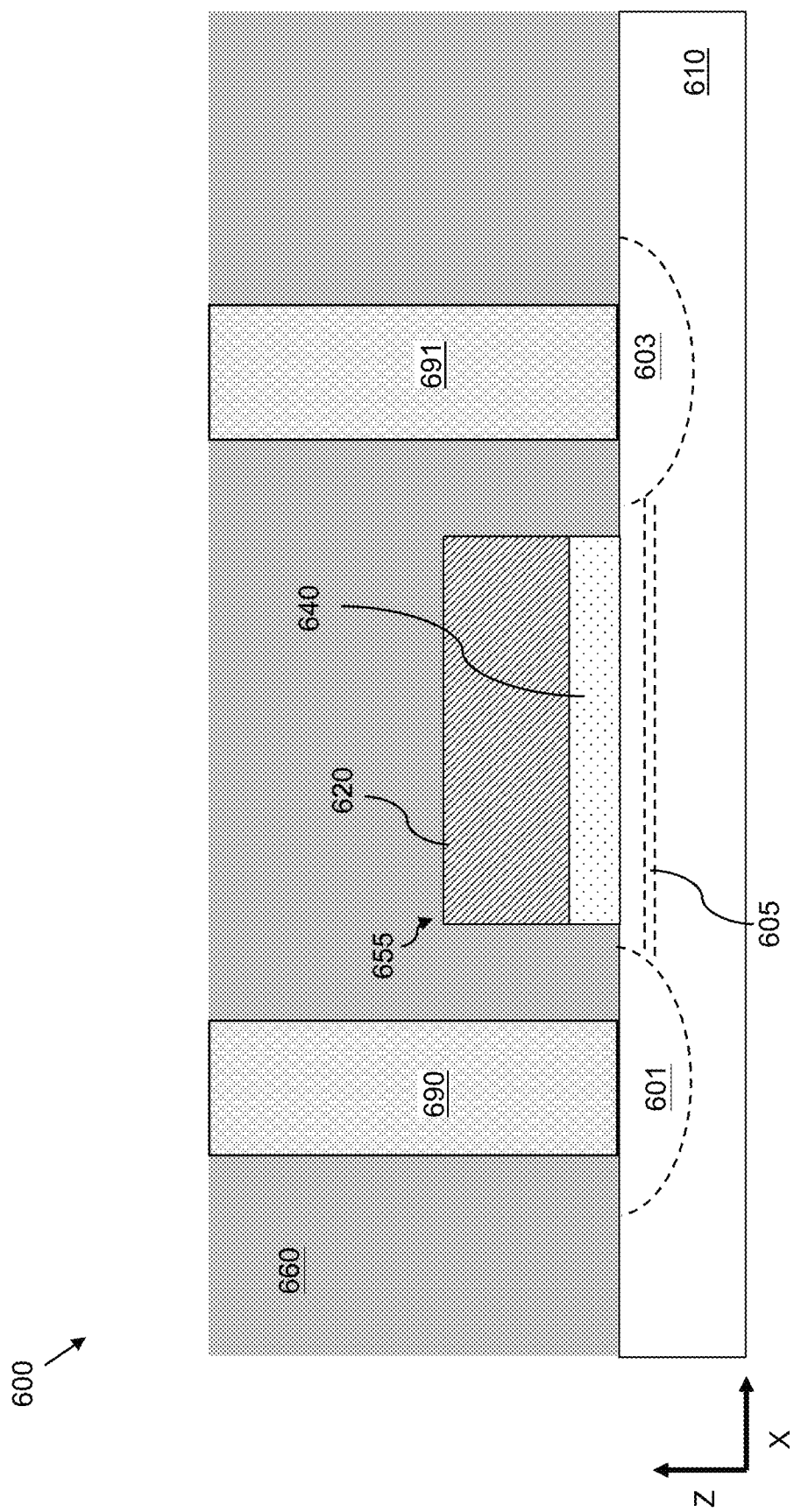
FIG. 7 is a vertical cross-section view of an alternative exemplary structure of a FeFET device including a top gate electrode structure according to an embodiment of the present disclosure.

FIG. 7 is a vertical cross-section view of an alternative exemplary structure of a FeFET device 600 including a top gate electrode structure according to an embodiment of the present disclosure. Referring to FIG. 7, the FeFET device 600 including a top gate electrode structure may include an FE material layer 640 located over a semiconductor material layer 610 and an upper gate electrode 620 located over the FE material layer 640. The upper gate electrode 620 and the FE material layer 640 may be included in a multilayer structure 655 that is located over a channel region 605 of the semiconductor material layer 610. Source and drain electrodes 690 and 691 may be located on opposite sides of the multilayer structure 655 and may contact source and drain regions 601 and 603, respectively, of the semiconductor material layer 610. A dielectric material layer 660 may be located over the upper surfaces of the multilayer structure 655 and the semiconductor material layer 610 and over the side surfaces of the multilayer structure 655. The dielectric material layer 660 may laterally surround the source electrode 690 and drain electrode 691 and may laterally separate the source electrode 690 and drain electrode 691 from the multilayer structure 655 including the upper gate electrode 620 and the FE material layer 640.

In various embodiments, the semiconductor material layer 610 may include an upper portion of a semiconductor material substrate, such as the semiconductor material substrate 10 shown in FIGS. 4A-4C. Alternatively, the semiconductor material layer 610 may be a semiconductor-on-insulator layer including a semiconductor material layer 610 as a top semiconductor layer overlying one or more buried insulator layers (such as one or more silicon oxide layer(s)). The semiconductor material layer 610 may be composed of a suitable semiconductor material, such as silicon, silicon germanium, a III-V semiconductor material (e.g., GaAs, GaAsIn, etc.), a II-VI semiconductor material (e.g., ZnO, MgO, GdO, etc.), or the like. In some embodiments, source and drain regions 601 and 603 may be formed in the semiconductor material layer 610 via a masked ion implantation process. In some embodiments, the semiconductor material layer 610 may be composed of an oxide semiconductor material, such as amorphous indium gallium zinc oxide (i.e., "a-IGZO"). Other suitable semiconductor materials are within the contemplated scope of disclosure.

A multilayer structure 655, which may also be referred to as a "gate stack," may be formed over the channel region 605 of the semiconductor material layer 610 by depositing multiple material layers over the upper surface of the semiconductor material layer 610, including at least a continuous FE material layer 640 and a continuous upper gate electrode layer 620, forming a patterned mask over the multiple material layers, and performing an etching process through the patterned mask to remove portions of the material layers and provide one or more discrete multilayer structures 655 over the upper surface of the semiconductor material layer 610. A dielectric material layer 660 may then be deposited over the upper surface of the semiconductor material layer 610 and over the upper surface and the side surfaces of the multilayer structure 655. Openings may be formed through the dielectric material layer 660 to expose the source and drain regions 601, 603 of the semiconductor material layer 610, and an electrically conductive material may be deposited in the openings to form source and drain electrodes 690 and 691 contacting the source and drain regions 601 and 603 of the semiconductor material layer 610.

Referring again to FIG. 7, the FE material layer 640 may include an equivalent composition and structure and may be formed using the same processes as FE material layer 240 described above with reference to FIG. 5B. Thus, repeated discussion of the FE material layer 640 is omitted. In various embodiments, the FE material layer 640 may be formed by ALD using a pulse sequence 100, 200 as described above with reference to FIGS. 1A and 1B. Similarly, the upper gate electrode 620 and the source and drain electrodes 690 and 691 may include an equivalent composition and structure and may be formed using the same processes as the bottom electrode layer 220 and the source and drain electrodes 290 and 291 described above with reference to FIGS. 5A and 5I, respectively. Thus, repeated discussions of the upper gate electrode 620 and the source and drain electrodes 690 and 691 is omitted.

In some embodiments, the multilayer structure 655 may further include an optional stress layer and/or an optional seed layer (not shown in FIG. 7) located between the upper surface of the semiconductor material layer 610 and the FE material layer 640. In some embodiments, the multilayer structure 655 may further include an optional seed layer (not shown in FIG. 7) located between the upper surface of the FE material layer 640 and the upper gate electrode 620. The optional stress layer and the optional seed layer(s) may include equivalent compositions and structures and may be formed using the same processes as the optional stress layer 230 and the optional seed layer 235 described above with reference to FIG. 6. Thus, repeated discussions of the optional stress layer and the optional seed layer are omitted.

Figure 8A:
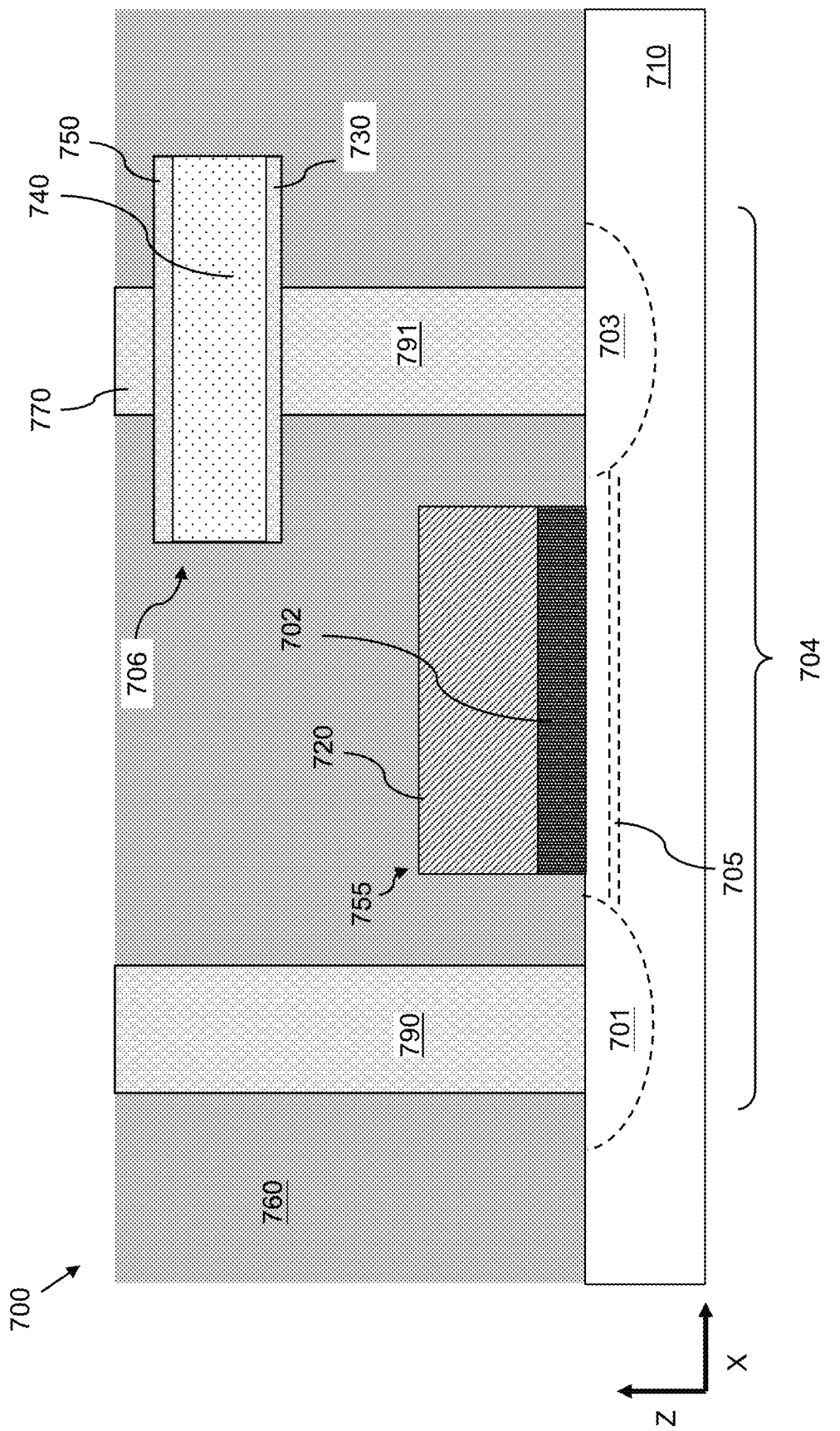
FIG. 8A is a vertical cross-section view of an exemplary structure of a FeRAM device according to an embodiment of the present disclosure.

FIG. 8A is a vertical cross-section view of an exemplary structure of a FeRAM device 700 according to an embodiment of the present disclosure. Referring to FIG. 8A, the FeRAM device 700 may include a capacitor 706 electrically coupled to an access transistor 704. In various embodiments, the access transistor 704 may be a field effect transistor (FET) and may have a structure that is similar to the structure of the FeFET device 600 shown in FIG. 7. In particular, a multilayer structure 755 (i.e., a "gate stack") may be located over surface of a semiconductor material layer 710. The multilayer structure 755 may overlie a channel region 705 of the semiconductor material layer 710.

Source and drain electrodes 790 and 791 may be located on opposite sides of the multilayer structure 755 and may contact source and drain regions 701 and 703, respectively, of the semiconductor material layer 710. A dielectric material layer 760 may be located over the upper surfaces of the multilayer structure 755 and the semiconductor material layer 710 and over the side surfaces of the multilayer structure 755. The dielectric material layer 760 may laterally surround the source and drain electrodes 790, 791 and may laterally separate the source and drain electrodes 790, 791 from the multilayer structure 755.

The multilayer structure 755 of the access transistor 704 may include a gate dielectric layer 702 over the semiconductor material layer 710 and a gate electrode (which may also be referred to as a "word line") over the gate dielectric layer 702. The multilayer structure 755 may be formed via an equivalent method as the multilayer structure 655 described above with reference to FIG. 7, thus repeated discussion is omitted. The gate dielectric layer 702 may be composed of any suitable dielectric material such as silicon oxide ($SiO_2$), or the like, or high-k dielectric materials such as silicon nitride ($Si_3N_4$), hafnium oxide ($HfO_2$), hafnium silicon oxide (HfSiO), hafnium tantalum oxide (HfTaO), hafnium titanium oxide (HfTiO), hafnium zirconium oxide ($Hd_{0.5}Zr_{0.5}O_2$), tantalum oxide ($Ta_2O_5$), aluminum oxide ($Al_2O_3$), hafnium dioxide-alumina ($HfO_2$— $Al_2O_3$), zirconium oxide ($ZrO_2$), or the like. In some embodiments, the gate dielectric layer 702 may be a native oxide layer formed on the substrate 710. In some embodiments, the gate dielectric layer 702 may include a ferroelectric material, such as hafnium zirconium oxide (HZO), Sc-doped AlN, or the like. Other suitable dielectric materials may also be within the contemplated scope of disclosure. In various embodiments, the gate dielectric layer 702 may be formed via a suitable deposition process as described above.

The gate electrode 720 and the source and drain electrodes 790 and 791 may include an equivalent composition and structure and may be formed using the same processes as the bottom electrode layer 220 and the source and drain electrodes 290 and 291 described above with reference to FIGS. 5A and 5I, respectively. Thus, repeated discussions of the gate electrode 720 and the source and drain electrodes 790 and 791 is omitted.

The capacitor 706 may include a first electrode plate 730 in electrical contact with the drain electrode 791 of the access transistor 704. In various embodiments, the first electrode plate 730 may be formed over an upper surface of the drain electrode 791 and may be laterally surrounded by the dielectric material layer 760. The first electrode plate 730 may have a length dimension along the x-axis direction that is greater than the length dimension of the drain electrode 791 along the x-axis direction. The first electrode plate 730 may be composed of any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), alloys thereof, and combinations of the same. Other suitable electrically conductive materials for first electrode plate 730 are within the contemplated scope of disclosure. The first electrode plate 730 may be formed using a suitable deposition process as described above.

Referring again to FIG. 8A, an FE material layer 740 may be located over the upper surface of the first electrode plate 730 of the capacitor 706. In some embodiments, the FE material layer 740 may have a length dimension along the x-axis direction that is equivalent to the length dimension of the first electrode plate 730. The FE material layer 740 may be laterally surrounded by the dielectric material layer 760. The FE material layer 740 may include an equivalent composition and structure and may be formed using the same processes as FE material layer 240 described above with reference to FIG. 5B. Thus, repeated discussion of the FE material layer 740 is omitted. In various embodiments, the FE material layer 740 of the capacitor 706 may be formed by ALD using a pulse sequence 100, 200 as described above with reference to FIGS. 1A and 1B.

Referring again to FIG. 8A, the capacitor 706 may also include a second electrode plate 750 located over an upper surface of the FE material layer 740. The second electrode plate 750 may have a length dimension along the x-axis direction that is equivalent to the length dimension of the first electrode plate 730 and the FE material layer 740. The second electrode plate 750 may be laterally surrounded by the dielectric material layer 760. The second electrode plate 750 may be composed of any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), alloys thereof, and combinations of the same. Other suitable electrically conductive materials for the second electrode plate 750 are within the contemplated scope of disclosure. The second electrode plate 750 may be formed using a suitable deposition process as described above.

Referring again to FIG. 8A, a conductor 770, such as a metal line or conductive via, may electrically contact the upper surface of the second electrode plate 750. The conductor 770 may have a length dimension along the x-axis direction that is less than the length dimension of the second electrode plate 750 along the x-axis direction. The conductor 770 may be composed of any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), alloys thereof, and combinations of the same. Other suitable electrically conductive materials for the conductor 770 are within the contemplated scope of disclosure. The conductor 770 may be formed using a suitable deposition process as described above.

In the embodiment FeRAM device 700 shown in FIG. 8A, the capacitor 706 is shown electrically coupled to the drain electrode 791 of the access transistor 704. However, in other embodiments, a capacitor 706 including a ferroelectric material layer 740 may be electrically coupled to the source electrode 790 of the access transistor 704.

Figure 8B:
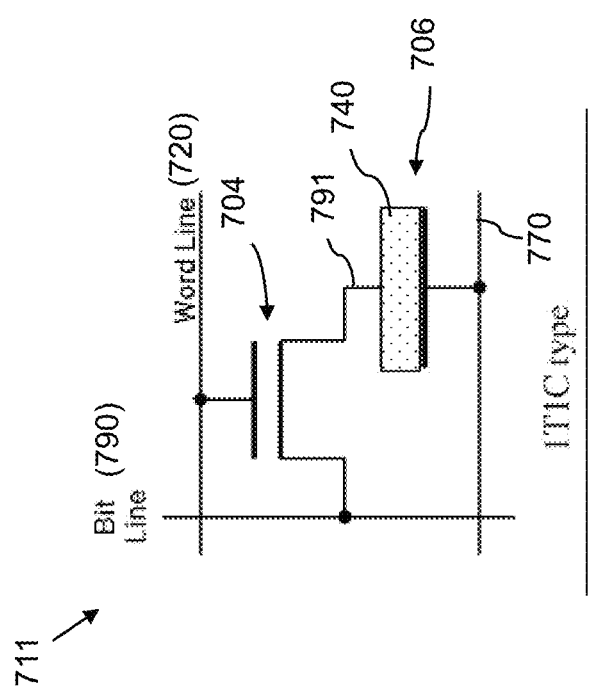
FIG. 8B is a circuit diagram that schematically illustrates a memory cell of a FeRAM device according to an embodiment of the present disclosure.

FIG. 8B is a circuit diagram that schematically illustrates a memory cell 711 of a FeRAM device such as the FeRAM device 700 described above with reference to FIG. 8A. Referring to FIG. 8B, the memory cell 711 includes an access transistor 704 coupled to a capacitor 706 that includes an FE material layer 740 as a capacitor dielectric material. A FeRAM memory device may include a plurality of memory cells 711 arranged in a two-dimensional or three-dimensional array configuration. In some embodiments, a conductive word line 720 may extend in a continuously in a first direction and may function as, or may be electrically coupled to, the gate electrodes 720 of access transistors 704 of a plurality of memory cells 711 of the array. A conductive bit line 790 may extend continuously in a second direction that may be transverse to the first direction and may function as, or may be electrically coupled to, the source electrodes 790 of access transistors 704 of a plurality of memory cells 711 of the array. The capacitor 706 of each memory cell 711 may be electrically coupled between the drain electrode 791 of the access transistor 704 and a conductive line 770. The access transistor 704 may control the current flow in the drain electrode 791 and may thereby control the charge applied to the capacitor 706. As discussed above, the charge state of the capacitor 706 may determine the direction of polarization of the FE material layer 740 and may therefore be used to program (i.e., write) the logic state of the memory cell 711. To read the logic state, the transistor may be controlled to re-program the capacitor 706 to a pre-determined logic state and the current response from the capacitor 706 may be detected. If the capacitor 706 was already programmed to have the same logic state as the predetermined logic state, no current is detected, thus indicating that the memory cell 711 was programmed to have the predetermined logic state. If the capacitor was programmed to have the opposite logic state as the predetermined logic state, the reversal of the polarization of the FE material layer 740 results in a detectable current response from the capacitor 706, thus indicating that the memory cell 711 was programmed to have the opposite logic state.

Figure 9:
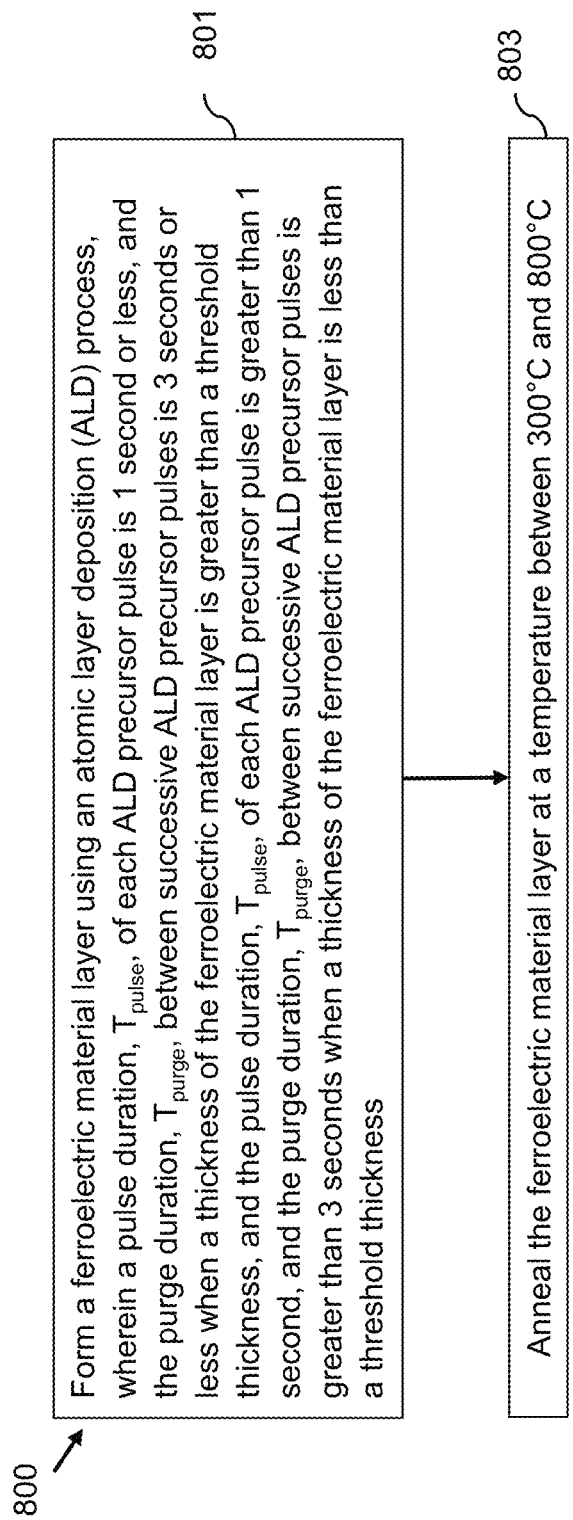
FIG. 9 is a flow chart illustrating steps of a method of forming ferroelectric device structures according to various embodiments of the present disclosure.

FIG. 9 is a flow chart illustrating steps of a method 800 of forming ferroelectric (FE) device structures, such as a FeFET device 400, 500, 600 shown in FIGS. 5I, 6 and 7, respectively, or a FeRAM device 700 as shown in FIG. 8A, according to various embodiments of the present disclosure. Referring to FIGS. 1A, 1B, 5B and 9, in step 801 of method 800, a ferroelectric (FE) material layer 240, 640, 740 may be formed using an atomic layer deposition (ALD) process. A pulse duration, Tpulse, of each ALD precursor pulse may be 1 second or less, and the purge duration, Tpurge, between successive ALD precursor pulses may be 3 seconds or less when a thickness of the ferroelectric material layer 240, 640, 740 is greater than a threshold thickness, and the pulse duration, Tpulse, of each ALD precursor pulse may be greater than 1 second, and the purge duration, Tpurge, between successive ALD precursor pulses may be greater than 3 seconds when a thickness of the ferroelectric material layer 240, 640, 740 is less than a threshold thickness. Referring to FIGS. 2A, 2B, 5B and 9, in step 803 of method 800, the ferroelectric material layer 240, 640, 740 may be annealed at a temperature between 300° C. and 900° C. for 1 second to 1 hour.

Referring to all drawings and according to various embodiments of the present disclosure, a ferroelectric field effect transistor (FeFET) device 400, 500, 600 includes a gate electrode 220, 620, a semiconductor channel layer 250, 610, a gate dielectric material comprising a ferroelectric material layer 240, 640 located between the gate electrode 220, 620 and the semiconductor channel layer 250, 610, where the ferroelectric material layer 240, 640 includes a mean grain size of 7 nm or more, a source electrode 290, 690 contacting the semiconductor channel layer 250, 610, and a drain electrode 291, 691 contacting the semiconductor channel layer 250, 610.

In an embodiment, the ferroelectric material layer 240, 640 includes a mean grain size between 8 nm and 12 nm.

In another embodiment, a thickness of the ferroelectric material layer 240, 640 is between 0.1 nm and 15 nm.

In another embodiment, the thickness of the ferroelectric material layer 240, 640 is between 0.1 nm and 10 nm.

In another embodiment, the ferroelectric material layer 240, 640 includes HfxZr1-xOy where 0≤x≤1 and y>0.

In another embodiment, the ferroelectric material layer 240, 640 is doped with one or more of aluminum (Al), silicon (Si), lanthanum (La), scandium (Sc), calcium (Ca), barium (Ba), gallium (Gd), yttrium (Y) and strontium (Sr).

In another embodiment, a volume of the ferroelectric material layer 240, 640 having a cubic, tetragonal and/or orthorhombic crystal structure is more than 50% greater than a volume of the ferroelectric material layer 240, 640 having a monoclinic crystal structure.

In another embodiment, the semiconductor channel layer 250, 610 includes an oxide semiconductor material having a formula MxM'yZnzO where 0<(x, y, z)<1, M is a first metal selected from a group consisting of indium (In) and tin (Sn) and combinations thereof, M' is a second metal selected from a group consisting of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd) and combinations thereof.

In another embodiment, the FeFET device 400, 500 includes a bottom gate configuration including the gate dielectric material 240 located over the gate electrode 220 and the semiconductor channel layer 250 located over the gate dielectric material 240.

In another embodiment, the gate electrode 220 is a buried gate electrode that is embedded in a dielectric material layer 210.

In another embodiment, the FeFET device 600 includes a top gate configuration including the gate dielectric material 640 located over the semiconductor channel layer 610, and the gate electrode 620 located over the gate dielectric material 640.

In another embodiment, the FeFET device 500 includes at least one of a stress layer 230 and a seed layer 235 located between the gate electrode 220 and the ferroelectric material layer 240.

In another embodiment, the FeFET device 500 includes at least one of a seed layer 235 and a blocking layer 245 located between the ferroelectric material layer 240 and the semiconductor channel layer 250.

An additional embodiment is drawn to a ferroelectric random access memory (FeRAM) device 700 including a transistor 704, the transistor 704 including a gate electrode 720, a semiconductor channel layer 710, a gate dielectric material 702 located between the gate electrode 720 and the semiconductor channel layer 710, a source electrode 790 contacting the semiconductor channel layer 710, and a drain electrode 791 contacting the semiconductor channel layer 710, and the FeRAM device 700 further includes a capacitor 706 including a first electrode plate 730 coupled to one of the source electrode 790 and the drain electrode 791 of the transistor 704, a second electrode plate 750, and a ferroelectric material layer 740 located between the first electrode plate 730 and the second electrode plate 750, where the ferroelectric material layer 740 includes a mean grain size of 7 nm or more.

In an embodiment, the ferroelectric material layer 740 includes a mean grain size between 8 nm and 12 nm.

In another embodiment, a thickness of the ferroelectric material layer 740 is between 0.1 nm and 15 nm.

In another embodiment, the ferroelectric material layer 740 includes HfxZr1-xOy where 0≤x≤1 and y>0.

An additional embodiment is drawn to a method of fabricating ferroelectric device structures including forming a ferroelectric material layer 240, 640, 740 using an atomic layer deposition (ALD) process, wherein a pulse duration, $T_{pulse}$, of each ALD precursor pulse is 1 second or less, and the purge duration, $T_{purge}$, between successive ALD precursor pulses is 3 seconds or less when a thickness of the ferroelectric material layer 240, 640, 740 is greater than a threshold thickness, and the pulse duration, $T_{pulse}$, of each ALD precursor pulse is greater than 1 second, and the purge duration, $T_{purge}$, between successive ALD precursor pulses is greater than 3 seconds when a thickness of the ferroelectric material layer 240, 640, 740 is less than a threshold thickness, and annealing the ferroelectric material layer 240, 640, 740 at a temperature between 300° C. and 900° C.

In an embodiment, the threshold thickness is 15 nm or less.

In another embodiment, the thickness of the ferroelectric material layer 240, 640, 740 is less than the threshold thickness, $T_{pulse}$ is in a range from 1 second to 5 seconds, and $T_{purge}$ is in a range from 3 seconds to 10 seconds.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a ferroelectric device structure, comprising:
    forming an electrode over a dielectric layer;
    forming a ferroelectric material layer over the electrode using an atomic layer deposition (ALD) process, wherein a pulse duration, $T_{pulse}$, of each ALD precursor pulse is 1 second or less, and a purge duration, $T_{purge}$, between successive ALD precursor pulses is 3 seconds or less when a thickness of the ferroelectric material layer is greater than a threshold thickness, and the pulse duration, $T_{pulse}$, of each ALD precursor pulse is greater than 1 second, and the purge duration, $T_{purge}$, between successive ALD precursor pulses is greater than 3 seconds when a thickness of the ferroelectric material layer is less than a threshold thickness, wherein the threshold thickness comprises a predetermined thickness of the ferroelectric material layer that is from 5 nm to 15 nm;
    annealing the ferroelectric material layer at a temperature from 300° C. and 900° C.;
    forming a semiconductor channel layer over the ferroelectric material layer; and
    removing, via an etching process through a patterned mask, portions of the electrode, the ferroelectric material layer, and the semiconductor channel layer, wherein remaining portions of the electrode, the ferroelectric material layer, and the semiconductor channel layer form a multilayer structure over the dielectric layer.

2. The method of claim 1, wherein the threshold thickness is from 8 nm and 12 nm.

3. The method of claim 1, wherein the thickness of the ferroelectric material layer is less than the threshold thickness.

4. The method of claim 3, wherein the thickness of the ferroelectric material layer is from 0.1 nm and 10 nm.

5. The method of claim 3, wherein $T_{pulse}$ is in a range from 1 second to 5 seconds.

6. The method of claim 5, wherein $T_{purge}$ is in a range from 3 seconds to 10 seconds.

7. The method of claim 3, wherein the ferroelectric material layer includes a mean grain size of 7 nm or more.

8. The method of claim 7, wherein the ferroelectric material layer includes a mean grain size from 8 nm and 12 nm.

9. The method of claim 1, wherein the ALD precursor pulses comprise at least one hafnium precursor pulse, at least one zirconium precursor pulse, and a plurality of oxygen precursor pulses that are introduced into an ALD reaction chamber, and the method further comprises introducing an inert gas into the ALD reaction chamber between each of the ALD precursor pulses.

10. The method of claim 1, further comprising:
    forming source and drain electrodes electrically connected to the semiconductor channel layer.

11. The method of claim 1, further comprising:
    forming a blocking layer comprising silicon over the ferroelectric material layer, wherein the semiconductor channel layer is formed over the blocking layer, and portions of the electrode, the ferroelectric material layer, the blocking layer, and the semiconductor channel layer are removed by the etching process through the patterned mask to form the multilayer structure over the dielectric layer.

12. A method of fabricating a ferroelectric structure, comprising:
    forming a first dielectric layer over a substrate;
    forming a first electrode over the first dielectric layer;
    forming a ferroelectric material layer over the first electrode using an atomic layer deposition (ALD) process, wherein a pulse duration, $T_{pulse}$, of each ALD precursor pulse is greater than 1 second, and a purge duration, $T_{purge}$, between successive ALD precursor pulses is greater than 3 seconds;
    forming a semiconductor channel layer over the ferroelectric material layer;
    removing, via an etching process through a patterned mask, portions of the first electrode, the ferroelectric material layer, and the semiconductor channel layer, wherein remaining portions of the first electrode, the ferroelectric material layer, and the semiconductor channel layer form a multilayer structure over the first dielectric layer;
    forming a second dielectric layer over the first dielectric layer and over an upper surface and lateral side surfaces of the multilayer structure; and
    forming second and third electrodes through the second dielectric layer and contacting the semiconductor channel layer.

13. The method of claim 12, wherein the ferroelectric material layer includes a mean grain size of 7 nm or more.

14. The method of claim 12, wherein a thickness of the ferroelectric material layer is 15 nm or less.

15. The method of claim 12, wherein the ferroelectric material layer comprises $Hf_xZr_{1-x}O_y$ where $0 \leq x \leq 1$ and $y>0$, and the semiconductor channel layer comprises an oxide semiconductor material having a formula $M_xM'_yZn_zO$ where $0<(x, y, z)<1$, M is a first metal selected from a group consisting of indium (In) and tin (Sn) and combinations thereof, M' is a second metal selected from a group consisting of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd) and combinations thereof.

16. A method of fabricating a ferroelectric structure, comprising:

sequentially introducing a plurality of precursor pulses including at least one hafnium precursor pulse, at least one zirconium precursor pulse, and at least one oxygen precursor pulse into a reaction chamber, wherein a pulse duration, $T_{pulse}$, of each precursor pulse is greater than 1 second, and a purge duration, $T_{purge}$, between successive precursor pulses is greater than 3 seconds, to form a layer of hafnium zirconium oxide having a thickness of 15 nm or less over a layer of an electrically conductive material;

performing an annealing process to promote crystallization of the layer of hafnium zirconium oxide, wherein following the annealing process, the layer of hafnium zirconium oxide comprises a mean grain size of 7 nm or more;

forming an oxide semiconductor material layer over the layer of hafnium zirconium oxide;

forming a patterned mask over the oxide semiconductor material layer; and etching the oxide semiconductor material layer, the layer of hafnium zirconium oxide, and the layer of the electrically conductive material through the patterned mask to form a multilayer structure comprising an electrode, a discrete layer of hafnium zirconium oxide over the electrode, and a discrete oxide semiconductor material layer over the discrete layer of hafnium zirconium oxide.

17. The method of claim 16, wherein the annealing process is performed at a temperature from 300° C. and 900° C. for between 1 second and 1 hour.

18. The method of claim 16, further comprising:

forming a blocking layer having a formula $Hf_{1-x}Si_xO_y$, where x>0.1 and y>0 over the layer of hafnium zirconium oxide; and forming the oxide semiconductor material layer over the blocking layer.

19. The method of claim 16, further comprising:

forming the layer of the electrically conductive material over a first dielectric layer, wherein the oxide semiconductor material layer, the layer of hafnium zirconium oxide, and the layer of the electrically conductive material are etched through the patterned mask to form a plurality of multilayer structures each comprising an electrode, a discrete layer of hafnium zirconium oxide over the electrode, and a discrete oxide semiconductor material layer over the discrete layer of hafnium zirconium oxide, and an upper surface of the first dielectric layer is exposed between respective multilayer structures.

20. The method of claim 19, further comprising:

forming a second dielectric layer over the first dielectric layer and over upper surfaces and lateral side surfaces of each multilayer structure; and forming source and drain electrodes through the second dielectric layer and electrically connected to the discrete oxide semiconductor material layer in each multilayer structure.

* * * * *